(12) United States Patent
Heckroth et al.

(10) Patent No.: US 12,418,277 B2
(45) Date of Patent: *Sep. 16, 2025

(54) VALIDATION OF CURRENT LEVELS DELIVERED BY A GATE DRIVER

(71) Applicant: Skyworks Solutions, Inc., Irvine, CA (US)

(72) Inventors: James E. Heckroth, Austin, TX (US); Ion C. Tesu, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 18/374,942

(22) Filed: Sep. 29, 2023

(65) Prior Publication Data

US 2024/0186988 A1 Jun. 6, 2024

Related U.S. Application Data

(63) Continuation of application No. 17/987,743, filed on Nov. 15, 2022, now Pat. No. 11,804,827, which is a
(Continued)

(51) Int. Cl.
*H02M 3/156* (2006.01)
*H02P 27/08* (2006.01)
(Continued)

(52) U.S. Cl.
CPC ............ *H03K 3/012* (2013.01); *H02P 27/08* (2013.01); *H03K 17/567* (2013.01); *H02P 27/06* (2013.01)

(58) Field of Classification Search
None
See application file for complete search history.

(56) References Cited

U.S. PATENT DOCUMENTS 6,097,582 A 8/2000 John
6,271,709 B1 8/2001 Kimura et al.
(Continued)

FOREIGN PATENT DOCUMENTS

CN 109687693 A 4/2019
JP 2020-057903 A 4/2020
(Continued)

OTHER PUBLICATIONS

Agilent Technologies, "2.0 Amp Gate Drive Optocoupler with Integrated (VCE) Desaturation Detection and Fault Status Feedback," HCPL-316J, Mar. 1, 2005, 33 pages.
(Continued)

*Primary Examiner* — Kenneth B Wells
(74) *Attorney, Agent, or Firm* — Knobbe, Martens, Olson & Bear, LLP

(57) ABSTRACT

A method for validating operation of a driver integrated circuit includes providing a signal using an output node. The signal is provided using multiple set points in response to a change in state of an input signal. Each set point corresponds to a different phase of a multi-phase transition of the signal. The method includes providing a timer value at an end of a phase of the multi-phase transition and determining whether the signal is in a target signal range of the phase based on the timer value at the end of the phase, a predetermined value defining the target signal range of the phase, and a predetermined time limit for the phase. A current through the output node may be provided using the multiple set points, and a voltage on the output node may have the multi-phase transition.

19 Claims, 9 Drawing Sheets

Related U.S. Application Data continuation of application No. 17/197,985, filed on Mar. 10, 2021, now Pat. No. 11,539,350.

(60) Provisional application No. 63/121,702, filed on Dec. 4, 2020.

(51) Int. Cl.
*H03K 3/012* (2006.01)
*H03K 17/16* (2006.01)
*H03K 17/567* (2006.01)
*H02P 27/06* (2006.01)

(56) References Cited

U.S. PATENT DOCUMENTS

| | | | |
|---|---|---|---|
| 6,473,280 B1 | 10/2002 | Buxton et al. | |
| 6,545,513 B2 | 4/2003 | Tsuchida et al. | |
| 6,717,785 B2 | 4/2004 | Fukuda et al. | |
| 6,967,519 B2 | 11/2005 | Nakayama et al. | |
| 7,180,337 B2 | 2/2007 | Feldtkeller | |
| 7,948,277 B2 | 5/2011 | Nakatake | |
| 7,978,453 B2 | 7/2011 | Sharaa | |
| 8,213,192 B2 | 7/2012 | Konecny et al. | |
| 8,237,376 B2 | 8/2012 | Franco | |
| 8,350,601 B2 | 1/2013 | Nagata et al. | |
| 8,362,800 B2 | 1/2013 | Or-Back | |
| 8,405,373 B2 | 3/2013 | Tsai et al. | |
| 8,723,590 B2 | 5/2014 | Curbelo et al. | |
| 8,829,955 B1 | 9/2014 | Goswami | |
| 8,985,850 B1 | 3/2015 | Godbole et al. | |
| 9,054,621 B2 | 6/2015 | Liu | |
| 9,077,240 B2 | 7/2015 | Cortigiani et al. | |
| 9,166,499 B2 | 10/2015 | Suzuki | |
| 9,184,743 B2 | 11/2015 | Shimizu | |
| 9,294,019 B2 | 3/2016 | Liu | |
| 9,374,028 B2 | 6/2016 | Nondahl | |
| 9,425,786 B2 | 8/2016 | Zoels et al. | |
| 9,455,566 B2 | 9/2016 | Hiyama | |
| 9,467,138 B2 | 10/2016 | Osanai | |
| 9,490,738 B2 | 11/2016 | Nondahl | |
| 9,608,623 B1 | 3/2017 | Kandah | |
| 9,698,654 B2 | 7/2017 | Santos et al. | |
| 9,698,728 B2 | 7/2017 | Kamath et al. | |
| 9,793,890 B2 | 10/2017 | Kirchner et al. | |
| 9,979,292 B2 | 5/2018 | Zhang et al. | |
| 9,998,110 B2 | 6/2018 | Zojer | |
| 10,038,434 B2 | 7/2018 | Volke | |
| 10,211,824 B2 | 2/2019 | Tsurumaru | |
| 10,461,730 B1 | 10/2019 | Mariconti et al. | |
| 10,469,057 B1 | 11/2019 | Frank et al. | |
| 10,469,075 B2 | 11/2019 | Horvath | |
| 10,514,016 B1 | 12/2019 | Nodake | |
| 10,587,262 B1 | 3/2020 | Morini et al. | |
| 10,587,268 B2 | 3/2020 | Li et al. | |
| 10,608,625 B1 | 3/2020 | Bernacchia et al. | |
| 10,680,601 B1 | 6/2020 | Kempitiya | |
| 10,715,132 B2 | 7/2020 | Takayama | |
| 10,742,108 B2 | 8/2020 | Tomisawa et al. | |
| 10,763,848 B2 | 9/2020 | Takano et al. | |
| 10,778,195 B2 | 9/2020 | Gokan | |
| 10,784,857 B1 | 9/2020 | Li et al. | |
| 10,790,818 B1 | 9/2020 | Frank | |
| 10,819,212 B1 | 10/2020 | Nagano et al. | |
| 10,917,083 B2 | 2/2021 | Masuhara et al. | |
| 11,057,029 B2 | 7/2021 | Westwick et al. | |
| 11,362,646 B1 | 6/2022 | Tesu et al. | |
| 11,533,027 B2 | 12/2022 | Du | |
| 11,539,350 B2 | 12/2022 | Heckroth et al. | |
| 11,804,827 B2 | 10/2023 | Heckroth et al. | |
| 11,870,440 B2 | 1/2024 | Tesu et al. | |
| 2002/0109417 A1 | 8/2002 | Torrisi et al. | |
| 2004/0136135 A1 | 7/2004 | Takahashi | |
| 2004/0251951 A1 | 12/2004 | Beck | |
| 2008/0106319 A1 | 5/2008 | Bayerer | |
| 2008/0315925 A1 | 12/2008 | Alfano | |
| 2009/0021294 A1 | 1/2009 | Morishita | |
| 2010/0148830 A1 | 6/2010 | Nilson | |
| 2011/0050198 A1 | 3/2011 | Dong et al. | |
| 2011/0157919 A1 | 6/2011 | Yedevelly et al. | |
| 2011/0157941 A1 | 6/2011 | Yedevelly et al. | |
| 2012/0013370 A1 | 1/2012 | Morishita | |
| 2012/0161841 A1 | 6/2012 | Dong et al. | |
| 2012/0194218 A1 | 8/2012 | Or-Bach et al. | |
| 2012/0218669 A1 | 8/2012 | Ioannidis et al. | |
| 2013/0088894 A1 | 4/2013 | Pal et al. | |
| 2013/0242438 A1 | 9/2013 | Fukuta | |
| 2014/0077782 A1 | 3/2014 | Cortigiani et al. | |
| 2015/0015309 A1 | 1/2015 | Werber | |
| 2015/0070078 A1 | 3/2015 | Jeong et al. | |
| 2015/0085403 A1 | 3/2015 | Santos et al. | |
| 2016/0087560 A1 | 3/2016 | Miller | |
| 2016/0218046 A1 | 7/2016 | Or-Bach et al. | |
| 2016/0359480 A1 | 12/2016 | Kim | |
| 2018/0026629 A1 | 1/2018 | Ptacek | |
| 2018/0115310 A1 | 4/2018 | Horiguchi et al. | |
| 2018/0351546 A1 | 12/2018 | Horvath | |
| 2019/0229640 A1 | 7/2019 | Aichriedler | |
| 2019/0372567 A1 | 12/2019 | Yoshida et al. | |
| 2020/0008918 A1 | 1/2020 | Goldberg et al. | |
| 2020/0057903 A1 | 2/2020 | Yamato et al. | |
| 2020/0089183 A1 | 3/2020 | Kallikuppa et al. | |
| 2020/0106433 A1 | 4/2020 | Yamato et al. | |
| 2021/0305927 A1 | 9/2021 | Kirby et al. | |
| 2022/0182052 A1* | 6/2022 | Heckroth | H03K 3/012 |
| 2022/0294427 A1 | 9/2022 | Tesu et al. | |
| 2024/0204756 A1 | 6/2024 | Heckroth et al. | |

FOREIGN PATENT DOCUMENTS

| | | |
|---|---|---|
| WO | WO 2022/119835 A1 | 6/2022 |
| WO | WO 2022/120021 A1 | 6/2022 |

OTHER PUBLICATIONS

Allan, R., "SiC and GaN vs. IGBTs: The Imminent Tug of War for Supremacy," Power Electronics, downloaded from powerelectronics.com, Feb. 24, 2020, 2 pages.

Analog Devices, Inc., "Isolated Half-Bridge Driver with Integrated High-Side Supply," ADuM5230, 2008-2013, 16 pages.

Analog Devices, Inc., "Isolated Half-Bridge Gate Driver with Integrated Isolated High-Side Supply," ADuM6132, 2008-2012, 16 pages.

Avago Technologies, "Desaturation Fault Detection Optocoupler Gate Drive Products with Feature: ACPL-333J, ACPL-330J, ACPL-332J, ACPL-331J, and HCPL-316J," Application Note 5324, Jan. 9, 2012, 7 pages.

Avago Technologies, "Dual-Output Gate Drive Optocoupler Interface with Integrated (VCE) DESAT Detection, FAULT and UVLO Status Feedback," ACPL-339J, Jan. 31, 2013, 23 pages.

Avago Technologies, "Active Miller Clamp Products with Feature: ACPL-331J, ACPL-332J," Application Note 5314, Jul. 21, 2010, 6 pages.

Broadcom, Data Sheet ACPL-352J 5.0 Amp Output Current IGBT and SiC/GaNMOSFET Gate Drive Optocoupler with Integrated Overcurrent Sensing, FAULT, GATE, and UVLO Status Feedback, May 15, 2020, 29 pages.

Infineon, "EiceDRIVER™ External Booster for Driver IC," Application Note, AN2013-10, Revision 1.6, Aug. 5, 2014, 17 pages.

Infineon, "EiceDRIVER™ High Voltage Gate Driver IC with Reinforced Isolation," Final Datasheet, Revision 2.1, Oct. 22, 2018, pp. 1-33.

Obara et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 22, 2018, pp. 4603-4611.

Schindler, A. et al., "10ns Variable Current Gate Driver with Control Loop for Optimized Gate Current Timing and Level Control for In-Transition Slope Shaping", IEEE Applied Power Electronics Conference and Exposition (APEC), Mar. 26-30, 2017, 6 pages.

(56) References Cited

OTHER PUBLICATIONS

Silicon Labs, "AN1009: Driving MOSFET and IGBT Switches Using the Si828x," downloaded from silabs.com on Feb. 21, 2020, 22 pages.
Silicon Labs, "Si8285/86 Data Sheet," downloaded from silabs.com on Feb. 21, 2020, 33 pages.
Texas Instruments, "Fully-Differential Isolation Amplifier," AMC1200 AMC1200B, Apr. 2011 —Revised Aug. 2012, 24 pages.
Texas Instruments, "Precision Lowest-Cost Isolation Amplifier," ISO124, Sep. 1997—Revised Sep. 2005, 17 pages.
Texas Instruments, "TI Designs, IGBT Gate Driver Reference Design for Parallel IGBTs with Short-Circuit Protection and External BJT Buffer," TIDUC70A, Dec. 2016—Revised Jan. 2017, 33 pages.
Texas Instruments, "Understanding the Short Circuit Protection for Silicon Carbide MOSFETs," TI TechNotes, Jan. 2018—Revised Mar. 2019, pp. 1-4.
Vacca, "Benefits and Advantages of Silicon Carbide Power Devices Over their Silicon Counterparts", Semiconductor Today, Compounds & Advanced Silicon, vol. 12, Issue 3, Apr./May 2017, 4 pages.
Zhao, S. et al., "Adaptive Multi-Level Active Gate Drivers for SiC Power Devices", IEEE Transactions on Power Electronics, vol. 35, No. 2, Feb. 2020, 17 pages.
International Search Report and Written Opinion mailed Mar. 28, 2022 for Application No. PCT/US2021/061196 in 12 pages.
International Search Report and Written Opinion mailed Apr. 13, 2022 for Application No. PCT/US2021/061564 in 8 pages.

\* cited by examiner

PHASE ONE PARAMETER VALUE SELECTIONS

TURN-ON PARAMETERS

ON_P1

| $I_{ON1\_SET}$ | $V_{PLAT\_ON}$ | $t_{ON1}$ |
|---|---|---|
| 111 | 110 | 010 |

TURN-OFF PARAMETERS

OFF_P1

| $I_{OFF1\_SET}$ | $V_{PLAT\_OFF}$ | $t_{OFF1}$ |
|---|---|---|
| 111 | 111 | 010 |

SOFT SHUTDOWN A PARAMETERS

SSA_P1

| $I_{SSA1\_SET}$ | $V_{PLAT\_SSA}$ | $t_{SSA1}$ |
|---|---|---|
| 101 | 111 | 010 |

SOFT SHUTDOWN B PARAMETERS

SSB_P1

| $I_{SSB1\_SET}$ | $V_{PLAT\_SSB}$ | $t_{SSB1}$ |
|---|---|---|
| 110 | 111 | 010 |

PHASE TWO PARAMETER VALUE SELECTIONS

ON_P2

| $I_{ON2\_SET}$ | $V_{GSON\_UV}$* (3-bits) | $t_{ON2}$ |
|---|---|---|
| 100 | | 010 |

OFF_P2

| $I_{OFF2\_SET}$ | $V_{MC}$* (3-bits) | $t_{OFF2}$ |
|---|---|---|
| 100 | | 011 |

SSA_P2

| $I_{SSA2\_SET}$ | $V_{MC}$* (3-bits) | $t_{SSA2}$ |
|---|---|---|
| 001 | | 111 |

SSB_P2

| $I_{SSB2\_SET}$ | $V_{MC}$* (3-bits) | $t_{SSB2}$ |
|---|---|---|
| 010 | | 110 |

PHASE THREE PARAMETER VALUE SELECTIONS

OFF_P3

| $I_{MC\_SET}$ | $V_{GSON\_OV}$* (3-bits) | $t_{OFF3}$ |
|---|---|---|
| 111 | | 010 |

SSA_P3

| $I_{MC\_SET}$** | $V_{GSOFF\_OV}$* (3-bits) | $t_{SSA3}$ |
|---|---|---|
| 111 | | 011 |

SSB_P3

| $I_{MC\_SET}$** | $V_{GSOFF\_OV}$* (3-bits) | $t_{SSB3}$ |
|---|---|---|
| 111 | | 011 |

PARAMETER VALUE LOOK-UP TABLES

INDEXED VALUES FOR CURRENT PARAMETERS

| 3-bit Index | 5-bit value (Current) |
|---|---|
| 000 | 00001 (0.39A) |
| 001 | 00010 (0.77A) |
| 010 | 01001 (3.48A) |
| 011 | 01101 (5.03A) |
| 100 | 10001 (6.58A) |
| 101 | 10110 (8.51A) |
| 110 | 11011 (10.45A) |
| 111 | 11111 (12.00A) |

To Working Registers — Current Setpoints

INDEXED VALUES FOR VOLTAGE PARAMETERS

| 3-bit Index | 5-bit value (Voltage) |
|---|---|
| 000 | 00011 (1.05V) |
| 001 | 00110 (2.10V) |
| 010 | 01111 (5.25V) |
| 011 | 10001 (5.95V) |
| 100 | 10010 (6.30V) |
| 101 | 10011 (6.65V) |
| 110 | 10100 (7.00V) |
| 111 | 10110 (7.70V) |

To Working Registers — Voltage Thresholds

INDEXED VALUES FOR TIME PARAMETERS

| 3-bit Index | 8-bit value (Time) |
|---|---|
| 000 | 00000100 (41.6ns) |
| 001 | 00000101 (62.4ns) |
| 010 | 00001010 (104.0ns) |
| 011 | 00010100 (208.0ns) |
| 100 | 01001001 (759.2ns) |
| 101 | 01011111 (998.4ns) |
| 110 | 01111111 (1320.8ns) |
| 111 | 11111111 (2652.0ns) |

To Working Registers — Timer Thresholds

*$V_{GSON\_UV}$, $V_{GSON\_OV}$, $V_{GSOFF\_OV}$ and $V_{MC}$ values are not selected using Parameter Lookup Tables

** $I_{MC}$ for SSA_P3 and SSB_P3 is same as OFF_P3

FIG. 7A

PARAMETER VALUE LOOK-UP TABLES

INDEXED VALUES FOR TIME PARAMETERS

| 3-bit Index | 8-bit value (Time) |
|---|---|
| 000 | 00000100 (41.6ns) |
| 001 | 00000101 (62.4ns) |
| 010 | 00001010 (104.0ns) |
| 011 | 00010100 (208.0ns) |
| 100 | 01001001 (759.2ns) |
| 101 | 01011111 (998.4ns) |
| 110 | 01111111 (1320.8ns) |
| 111 | 11111111 (2652.0ns) |

INDEXED VALUES FOR VOLTAGE PARAMETERS

| 3-bit Index | 5-bit value (Voltage) |
|---|---|
| 000 | 00011 (1.05V) |
| 001 | 00110 (2.10V) |
| 010 | 01111 (5.25V) |
| 011 | 10001 (5.95V) |
| 100 | 10010 (6.30V) |
| 101 | 10011 (6.65V) |
| 110 | 10100 (7.00V) |
| 111 | 10110 (7.70V) |

INDEXED VALUES FOR CURRENT PARAMETERS

| 3-bit Index | 5-bit value (Current) |
|---|---|
| 000 | 00001 (0.39A) |
| 001 | 00010 (0.77A) |
| 010 | 01001 (3.48A) |
| 011 | 01101 (5.03A) |
| 100 | 10001 (6.58A) |
| 101 | 10110 (8.51A) |
| 110 | 11011 (10.45A) |
| 111 | 11111 (12.00A) |

WORKING REGISTERS — TIMER THRESHOLDS

| | |
|---|---|
| $t_{ON1}$ | 00001010 (104.0ns) |
| $t_{ON2}$ | 00001010 (104.0ns) |
| $t_{OFF1}$ | 00001010 (104.0ns) |
| $t_{OFF2}$ | 00010100 (208.0ns) |
| $t_{OFF3}$ | 00001010 (104.0ns) |
| $t_{SSA1}$ | 00001010 (104.0ns) |
| $t_{SSA2}$ | 11111111 (2652.0ns) |
| $t_{SSA3}$ | 00010100 (208.0ns) |
| $t_{SSB1}$ | 00001010 (104.0ns) |
| $t_{SSB3}$ | 00010100 (208.0ns) |
| $t_{SSB2}$ | 01111111 (1320.8ns) |

WORKING REGISTERS — VOLTAGE THRESHOLDS

| | |
|---|---|
| $V_{PLAT\_ON}$ | 10100 (VMID+7.00V) |
| $V_{PLAT\_OFF}$ | 10110 (VMID+7.70V) |
| $V_{PLAT\_SSA}$ | 10110 (VMID+7.70V) |
| $V_{PLAT\_SSB}$ | 10110 (VMID+7.70V) |

WORKING REGISTERS — CURRENT SETPOINTS

| | |
|---|---|
| $I_{ON1\_SET}$ | 11111 (12.00A) |
| $I_{ON2\_SET}$ | 10001 (6.58A) |
| $I_{OFF1\_SET}$ | 11111 (12.00A) |
| $I_{OFF2\_SET}$ | 10001 (6.58A) |
| $I_{MC\_SET}$ | 11111 (12.00A) |
| $I_{SSA1\_SET}$ | 10110 (8.51A) |
| $I_{SSA2\_SET}$ | 00010 (0.77A) |
| $I_{SSB1\_SET}$ | 11011 (10.45A) |
| $I_{SSB2\_SET}$ | 01001 (3.48A) |

FIG. 7B

VALIDATION OF CURRENT LEVELS DELIVERED BY A GATE DRIVER

CROSS-REFERENCE TO RELATED APPLICATION(S)

This application is a continuation of U.S. application Ser. No. 17/987,743, filed Nov. 15, 2022, now U.S. Pat. No. 11,804,827, which is a continuation of U.S. application Ser. No. 17/197,985, filed Mar. 10, 2021, now U.S. Pat. No. 11,539,350, which claims the benefit of U.S. Provisional Application No. 63/121,702, entitled "VARIABLE-CURRENT DRIVE FOR ISOLATED GATE DRIVERS," naming Ion C. Tesu, James E. Heckroth, Stefan N. Mastovich, John N. Wilson, Krishna Pentakota, Michael Ireland, Greg Ridsdale, and Lyric Jackson as inventors, filed on Dec. 4, 2020. Each of the foregoing is incorporated herein by reference.

This application is related to U.S. patent application Ser. No. 17/138,091, entitled "VARIABLE CURRENT DRIVE FOR ISOLATED GATE DRIVERS," naming Ion C. Tesu, James E. Heckroth, Stefan N. Mastovich, John N. Wilson, Krishna Pentakota, Michael Ireland, Greg Ridsdale, and Lyric Jackson as inventors, filed on Dec. 30, 2020, now U.S. Pat. No. 11,362,646, which application is incorporated herein by reference.

BACKGROUND

Field of the Invention

This disclosure is related to circuits and more particularly to control circuits for high-power applications.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be grounded at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and output driver to provide the control signal at voltage levels suitable for the load system.

Referring to FIG. 1, in an exemplary motor control application, processor 100, which may be a microprocessor, microcontroller, or other suitable processing device, operates in a first domain (i.e., VDD1, e.g., 5 Volts (V)) and provides one or more signals for a high-power load system operating in a second domain (i.e., VDD3, e.g., 800 V). Systems 102 each include an isolation barrier 130 and an isolation communications channel for safely communicating control signals from processor 100 to drivers 106, which drive high-power drive devices 108 and 109 of a three-phase inverter used to deliver three-phase power to motor 120. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time.

Voltage converters 104 convert an available power supply voltage from VDD1 or VDD3 to a voltage level (i.e., VDD2, e.g., approximately 15 V) usable by the high-voltage side of systems 102 and drivers 106. Note that in other embodiments, a single voltage converter 104 converts one power supply voltage from a first voltage level (e.g., VDD3) to multiple other voltage levels (e.g., VDD1 and VDD2) and/or provides multiple outputs of a particular voltage (e.g., multiple VDD2 outputs corresponding to multiple systems 102). Drivers 106 provide switch control signals at levels required by corresponding high-power drive devices 108 or 109 of the three-phase inverter. The load motor requires three-phase power at high power levels. Systems 102 that correspond to high-power devices coupled to VDD3 (high-side inverter devices), are grounded at a voltage that is switching with respect to earth ground by the high voltage levels of VDD3. Typical high-power drive devices 108 and 109 of the three-phase inverter that are used to drive motor 120 require substantial turn-on voltages (e.g., voltages in the range of tens of Volts) and are susceptible to fault conditions that may damage those devices.

Exemplary isolated gate drivers are used in industrial and automotive applications. Conventional embodiments of gate drivers use fixed resistors to determine a fixed drive strength during the high-power drive device normal turn-on and normal turn-off process. The fixed drive strength determines a compromise between the competing goals of maximizing efficiency, minimizing radiated and conducted emissions (i.e., electromagnetic interference (EMI)), and limiting voltage stress on the external high-power drive device. Accordingly, improved techniques for controlling high-power drive devices are desired.

SUMMARY OF EMBODIMENTS OF THE INVENTION

In at least one embodiment, a method for validating operation of a driver integrated circuit includes providing a signal using an output node. The signal is provided using multiple set points in response to a change in state of an input signal. Each set point corresponds to a different phase of a multi-phase transition of the signal. The method includes providing a timer value at an end of a phase of the multi-phase transition. The method includes determining whether the signal is in a target signal range of the phase based on the timer value at the end of the phase, a predetermined value defining the target signal range of the phase, and a predetermined time limit for the phase. The output node may be coupled to a control terminal of a high-power drive device. A current through the output node may be provided using the multiple set points, and a voltage on the output node may have the multi-phase transition. The signal may cause a corresponding multi-phase transition of the high-power drive device in response to the change in the state of the input signal. The end of the phase may be determined based on a sensed voltage level on the output node, a predetermined threshold level, the timer value, and the predetermined time limit for the phase.

In at least one embodiment, a system for validating operation of a driver integrated circuit includes the driver integrated circuit. The driver integrated circuit includes an output node and a variable strength driver circuit coupled to the output node. The variable strength driver circuit is configured to provide a signal to the output node. The signal is provided using multiple set points in response to a change in state of an input signal. Each set point corresponds to a different phase of a multi-phase transition of the signal. The driver integrated circuit further includes a timer circuit configured to provide a timer value at an end of a phase of the multi-phase transition. The driver integrated circuit further includes a driver controller circuit configured to determine whether the signal is in a target signal range of the phase based on the timer value at the end of the phase, a predetermined value defining the target signal range of the phase, and a predetermined time limit for the phase. The system may include a high-power drive device coupled to the output node. A current through the output node may be provided using the multiple set points, and a voltage on the output node may have the multi-phase transition. The signal may cause a corresponding multi-phase transition of the high-power drive device in response to the change in the state of the input signal.

In at least one embodiment, a system for controlling a high-power drive device using a control signal includes an output node and a variable strength driver circuit configured to provide a signal to the output node having a signal level based on a multi-bit digital control signal. The high-power drive device includes a control circuit configured to generate the multi-bit digital control signal corresponding to a target strength of the variable strength driver circuit and configured to generate an indication of an actual strength of the variable strength driver circuit corresponding to the multi-bit digital control signal based on a predetermined profile of a multi-phase transition of the signal, a first indication of a first parameter associated with the signal, a second indication of a second parameter associated with the signal, and a margin value of the predetermined profile. The margin value corresponds to the target strength of the variable strength driver circuit. In at least one embodiment of the system, the variable strength driver circuit is a variable current driver circuit, and the control circuit validates an actual current through the output node during a phase of the multi-phase transition in response to the multi-bit digital control signal. The actual current may be validated based on a timer value at an end of the phase of the multi-phase transition. The multi-phase transition may be triggered in response to a change in state of the control signal.

BRIEF DESCRIPTION OF THE DRAWINGS

The present invention may be better understood, and its numerous objects, features, and advantages made apparent to those skilled in the art by referencing the accompanying drawings.

FIGS. 7A and 7B illustrate exemplary variable current driver working registers and parameter values consistent with at least one embodiment of the invention.

The use of the same reference symbols in different drawings indicates similar or identical items.

DETAILED DESCRIPTION

Figure 2:
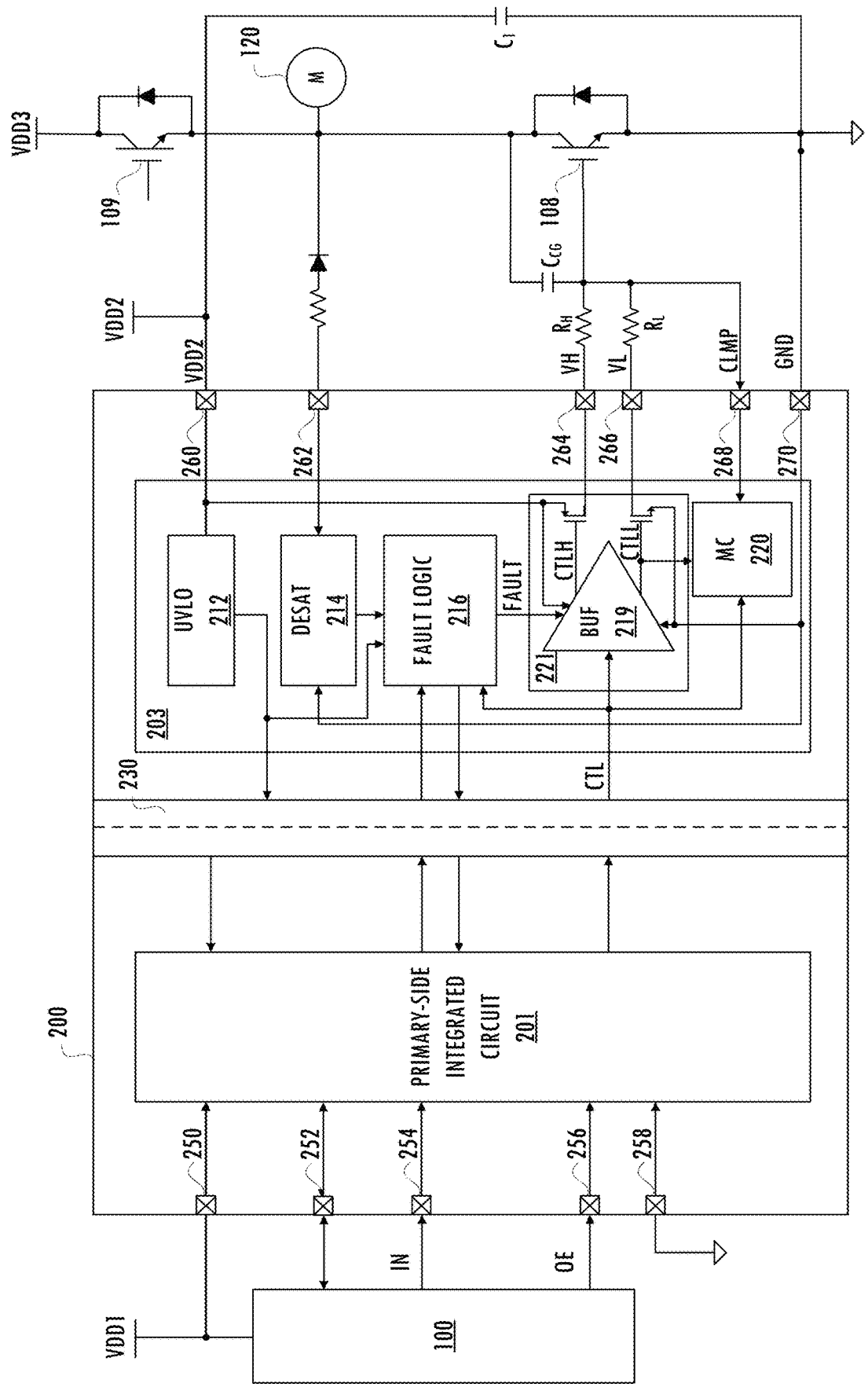
FIG. 2 illustrates a functional block diagram of a portion of the motor control system of FIG. 1 including exemplary fault detection circuitry and driver control circuits.

Referring to FIG. 2, in an exemplary motor control application, processor 100 receives a voltage (i.e., VDD1, e.g., 5V) and provides one or more signals for a high power load system operating in a second domain (i.e., VDD3, e.g., hundreds of volts). Driver product 200 includes isolation barrier 230 and a communication channel for safely communicating control signals from processor 100 across isolation barrier 230 to drive a high-power drive device of a three-phase inverter used to deliver three-phase power to motor 120. In an exemplary embodiment, driver product 200 includes multiple integrated circuits configured as a multi-chip module in a single package. For example, driver product 200 includes primary-side integrated circuit 201 and secondary-side integrated circuit 203. Primary-side integrated circuit 201, receives a control signal from processor 100 and communicates the signal across isolation barrier 230 to secondary-side integrated circuit 203. In such embodiments, terminals 250, 252, 254, . . . , 270 are pins of a package of the multi-chip module and are coupled to external elements, e.g., discrete resistors and capacitors, and to processor 100.

Driver product 200 includes isolation barrier 230, which isolates the domains on a first side (e.g., primary-side integrated circuit 201) of driver product 200, which operates using VDD1 (e.g., a voltage less than ten volts), and a second side (e.g., secondary-side integrated circuit 203) of driver product 200, which operates using VDD2 (e.g., a voltage of tens of volts). An isolation communications channel facilitates communication between primary-side integrated circuit 201 and secondary-side integrated circuit 203. Any suitable communications technique that does not use a conductive path between the two sides may be used, e.g., optical, capacitive, inductive, or electromagnetic techniques. The isolation communications channel facilitates communication of a control signal to secondary-side integrated circuit 203 from processor 100 via primary-side integrated circuit 201.

An exemplary isolation communications channel uses digital modulation (e.g., on-off keying modulation) to communicate one or more digital signals between primary-side integrated circuit 201 and secondary-side integrated circuit 203, although other communication protocols may be used. In general, on-off keying modulation is a form of amplitude-shift keying modulation that represents digital data as the presence or absence of a carrier wave or oscillating signal having a carrier frequency fc (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

Secondary-side integrated circuit 203 includes driver 221, which generates one or more output control signals based on received control signal CTL received from primary-side integrated circuit 201, which receives control signal IN on terminal 254 from processor 100. Driver 221 provides corresponding signals to terminals 264 and 266. Buffer 219 generates control signals CTLH and CTLL at appropriate signal levels for controlling pull-up and pull-down devices of driver 221, respectively. Buffer 219 may generate one control signal or two separate control signals for the pull-up device and the pull-down device based on received control signal CTL. External resistance $R_H$ adjusts the pull-up strength by $1/R_H$ independently from external resistance $R_L$ that adjusts the pull-down strength by $1/R_L$. Although received control signal CTL is illustrated as a single-ended signal based on input control signal CTL received from processor 100 on terminal 254, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 108 can be independently adjusted from on-resistance $R_{DS(ON)}$ of the integrated pull-up output device coupled to terminal 264 using one or more passive elements. For example, resistance $R_H$ adjusts the pull-up strength. Resistor $R_L$ adjusts the pull-down strength of the signal provided to the gate of high-power drive device 108 via terminal 266 to have a strength different from the pull-up strength of the signal provided to the gate of high-power drive device 108. In a typical configuration, the pull-up time is slower than the pull-down time and resistances $R_H$ and $R_L$ will vary with specifications of the device (e.g., power MOSFET, IGBT, GaN MOSFET, Si-Carbide power MOSFET, etc.) used as high-power drive device 108.

In at least one embodiment, the isolation communications channel feeds back voltage information or fault information from secondary-side integrated circuit 203 to primary-side integrated circuit 201. Primary-side integrated circuit 201 or processor 100 uses that information to adjust operating parameters or generate one or more fault indicators that may be used for automatically handling faults by controlling output driver 221 accordingly. For example, secondary-side integrated circuit 203 includes modules that detect fault conditions associated with high-power drive devices, e.g., desaturation detector 214, and may also detect user-initiated faults received from processor 100. Fault indicator(s) may be used by secondary-side integrated circuit 203 to prevent damage to the high-power drive devices, load system, or user of the load system. In addition, secondary-side integrated circuit 203 may send an indication of a fault or associated diagnostic information to primary-side integrated circuit 201 and/or processor 100.

In at least one embodiment, secondary-side integrated circuit 203 includes desaturation fault protection for high-power semiconductor devices, which protects against short-circuit current events that may destroy high-power drive device 108. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 1 and 2 (e.g., both devices of an individual inverter phase of a three-phase inverter are on), high current flows through high-power drive devices 108 and 109 and may destroy high-power drive devices 108 and 109. Accordingly, a fault detection technique detects this desaturation condition. Driver product 200 may send an indicator thereof to processor 100.

In at least one embodiment of driver product 200, desaturation fault protection turns off high-power drive device 108 following detection of the fault condition. In a typical application, terminal 262 is coupled to an external resistor and diode that are coupled to a terminal of high-power drive device 108 (e.g., the collector terminal of an IGBT or drain terminal of a MOSFET). In at least one embodiment of driver product 200, desaturation detection circuit 214 is enabled only while high-power drive device 108 is turned on. Desaturation detection circuit 214 senses when the collector-emitter voltage (or drain-to-source voltage, as the case may be) of high-power drive device 108 exceeds a predetermined threshold level (e.g., 7V). Note that the predetermined threshold level of desaturation detection circuit 214 may be externally adjusted based on the forward voltage of one or more diodes coupled to the desaturation resistor coupled to terminal 262 or based on the resistance of the desaturation resistor. In addition, a delay time may be introduced by coupling a capacitor between terminal 262 and an external power supply node.

In general, undervoltage lockout detector 212 prevents application of insufficient voltage to the control terminal of high-power drive device 108 by forcing the output on terminal 264 to be low during power-up of driver product 200. Undervoltage lockout detector 212 detects when the power supply voltage (e.g., VDD2 sensed using terminal 260) exceeds a first predetermined undervoltage lockout threshold voltage and generates an indication thereof, which may be used to disable the lockout condition. Undervoltage lockout detector 212 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 212 may be provided to processor 100 using terminal 252. In at least one embodiment, driver product 200 includes a similar mechanism for an overvoltage condition.

Miller clamp 220 reduces effects of parasitic turn-on of high-power drive device 108 due to charging of the Miller capacitor (e.g., the collector-to-gate parasitic capacitor of an IGBT device or the drain-to-gate parasitic capacitor of a MOSFET in other embodiments of high-power device 108). That gate-to-collector coupling can cause a parasitic turn on of device 108 in response to a high transient voltage (e.g., a gate voltage spike) generated while high-power drive device 108 is turned off. A gate voltage spike is created when turning on another high-power drive device coupled to high-power drive device 108.

For example, when turning on upper high-power drive device 109, a corresponding lower high-power drive device 108 coupled to upper high-power drive device 109 experiences a voltage change $dV_{CE}/dt$ causing current flow into the gate drive terminal coupled to lower high-power drive device 108. In the absence of Miller clamp 220, this current would create a voltage drop across external resistance $R_L$ and would increase the gate-to-emitter voltage of a corresponding lower high-power drive device 108. If the gate-to-emitter voltage exceeds the device threshold voltage (e.g., 2 V), then high-power drive device 108 turns on. A similar parasitic turn-on event occurs when turning on high-power drive device 108 and the corresponding upper high-power drive device 109 is in an off state. Miller clamp 220 prevents parasitic turn-on by coupling terminal 268 to ground via a low-resistance switch that hinders or prevents the Miller capacitor current from developing a voltage sufficient to turn on the high-power drive device.

In some embodiments of driver product 200, Miller clamp 220 is not needed because a sufficiently sized gate capacitor coupled between the gate and emitter of each high-power drive device 108 shunts any Miller current and raises the level of the transient needed to parasitically turn on the device. However, such embodiments increase the gate charge voltage required to reach the threshold voltage of high-power drive device 108, increase the driver power, and increase switching losses of high-power drive device 108. In other embodiments of driver product 200 that do not use a Miller clamp circuit, the lower supply voltage is coupled to a negative voltage (e.g., −5 V) rather than ground. This configuration provides additional voltage margin to increase the likelihood that the parasitic turn-on transient does not raise the control terminal of high-power drive device 108 above its threshold voltage. However, this configuration increases cost by requiring an additional pin on the package and requiring generation of the negative voltage.

Upon detection of a fault condition by modules on secondary-side integrated circuit 203, fault logic 216 generates control signal FAULT, which may initiate shutdown of high-power drive device 108. Fault logic 216 reports the fault condition to processor 100 via primary-side integrated circuit 201. Alternatively, fault logic 216 only reports the fault condition to primary-side integrated circuit 201 and high-power drive device 108 continues operation. Then, primary-side integrated circuit 201 reports the fault condition to processor 100. Since a system may include multiple high-power drive devices (e.g., six high-power drive devices in the exemplary motor control application described herein), shutting down only one of these devices may harm the high-power drive devices or the load. Therefore, in response to detection of a fault, processor 100 may initiate a shutdown of high-power drive device 108 only after detecting a predetermined number of faults over a particular period of time or other condition is satisfied. In at least one embodiment, processor 100 initiates shutdown of high-power drive device 108 independently from any fault detection of driver product 200 (e.g., based on fault detection from another driver product 200 associated with another high-power drive device 108 or 109).

An abrupt shutoff of high-power drive device 108 may result in large di/dt induced voltages. Such voltage spikes could be damaging to high-power drive circuit 108 or the load. Accordingly, in response to a fault condition, processor 100 or driver product 200 initiates a soft shutdown of high-power drive device 108 that slowly discharges the control terminal of high-power drive device 108 at a rate having a turn-off time longer than the regular turn-off time of the output control signal. For example, fault logic 216 receives an indicator from desaturation detection circuit 214 and generates control signal FAULT based thereon that initiates a soft shutdown. In other embodiments, fault logic 216 receives an indicator from one or more other fault detection circuits. Typical implementations of a soft-shutdown function in a driver product may use an additional terminal or at least one additional external resistor coupled to terminal 264 or terminal 266.

A variable current drive technique partitions a transition (e.g., a turn-on or a turn-off) of a state (e.g., on or off) of a high-power drive device into multiple phases (i.e., intervals) that can have different characteristics. The use of variable current driver reduces or eliminates the need for external gate resistors for control of a transition of the state of the high-power drive device. The use of multiple current settings for an output gate driver current (e.g., a gate current of the high-power drive device) during a transition of the output signal improves the transition of the state of the high-power drive device and corresponding efficiency level of the system (i.e., the ratio of useful work performed by the system to the total energy expended by the system, which affects the range of an electric vehicle per battery charge in an exemplary electric vehicle application), reduces EMI, and reduces voltage stress of the high-power drive device, as compared to conventional approaches.

In at least one embodiment of the variable current drive technique, the change of target current levels during a transition of a state of a high-power drive device is based on an indication of a control voltage of the high-power drive device (e.g., gate-to-source voltage $V_{GS}$ sensed using the output node of the gate driver product) and a corresponding time limit. For example, a target current level is changed from a first predetermined current level to a second predetermined current level in response to the gate-to-source voltage $V_{GS}$ of the high-power drive device reaching or exceeding the Miller plateau. The Miller plateau refers to a region of the gate-to-source voltage time response, where the gate-to-source voltage $V_{GS}$ is almost constant and is a region in which the state of the high-power drive device is switching between a first state (e.g., an off-state) to a second state (e.g., an on-state). The Miller plateau is defined by gate-to-source voltage level $V_{PLAT\_ON}$ and gate-to-source voltage level $V_{PLAT\_OFF}$, which are inflection points in the response of gate-to-source voltage $V_{GS}$. In at least one embodiment, an objective of the variable current drive technique is to reach the Miller plateau voltage as quickly as possible. However, to limit electromagnetic interference caused by the current of the variable current drive, the variable current drive technique drives the high current level only for a limited time and decreases the current after reaching the Miller plateau voltage or the expiration of a corresponding time limit. Accordingly, the variable current driver initially drives a high gate current level (e.g., 12 A) to reduce the time required to charge the gate of the high-power drive device to the Miller plateau voltage (or discharge the gate of the high-power drive device to the Miller plateau voltage, as the case may be), after which the variable current driver drives another current level to the gate of the high-power drive device (e.g., 6 A) that achieves a target change in drain-to-source (or collector-to-emitter) voltage as a function of time (e.g., $dV_{DS}/dt_{ON}$ or $dV_{DS}/dT_{OFF}$) for the remainder of the transition of the state of the high-power drive device. The variable current drive technique provides improved capability to optimize the tradeoff between faster switching speed for efficiency, lower $dV_{GS}/dt$ for reduced EMI, and reduced drive device output voltage overshoot as compared to conventional gate driver implementations.

In at least one embodiment of the variable current drive technique, changing target output current levels based on a time limit is used in addition to, or instead of, a threshold voltage criterion for triggering a change to a target output current level. In at least one embodiment, the variable current drive technique uses a combination of the threshold voltage criteria and a time limit (e.g., to change a target current level based on a threshold voltage or based on a time limit, whichever is reached first) to provide more reliable operation in high-noise environments where incorrect switching might otherwise occur due to noise. In at least one embodiment, the variable current drive technique measures elapsed time using a digital counter. In at least one embodiment, the variable current drive technique measures elapsed time using an RC-based system. For example, one or more timers generate indicators of how much time has elapsed since the start of a phase of a multi-phase transition process. Even if a target voltage level has not been achieved on the output node, the variable current drive technique changes the target current level and enters a next phase of the multi-phase transition process in response to expiration of a predetermined amount of time, e.g., to reduce EMI, or in response to expiration of a predetermined amount of time and another condition (e.g., a sensed current level or a sensed voltage level exceeding a predetermined threshold level).

Figure 3:
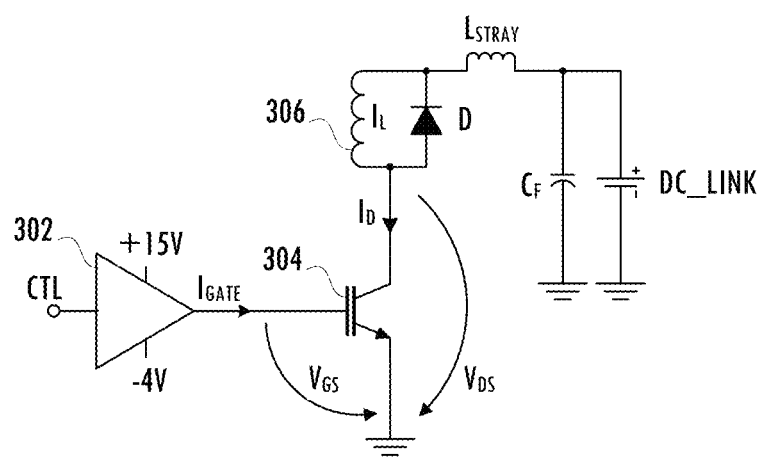
FIG. 3 illustrates an exemplary simplified representation of the portion of the motor control system of FIG. 2.
Figure 4:
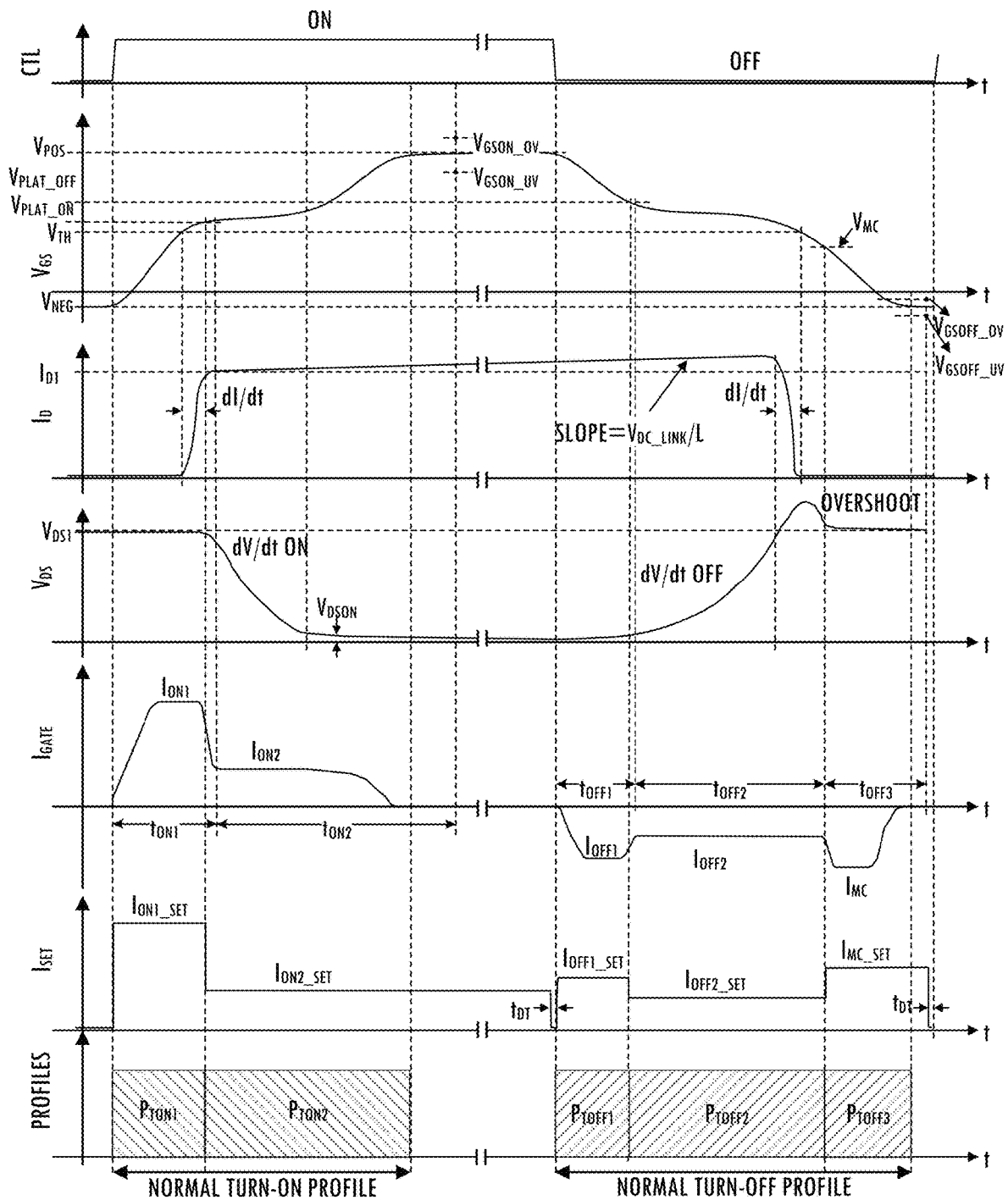
FIG. 4 illustrates timing waveforms and switching parameter definitions consistent with at least one embodiment of the invention.

FIGS. 3 and 4 illustrate an exemplary implementation of the variable current drive technique including a multi-phase turn-on process and a multi-phase turn-off process. An exemplary high-power gate driver powered using +15V and −4V power supplies drives high-power drive device 304. Inductor 306, which has an initial condition of $I_L$=20 A and is coupled in parallel with a diode, represents an exemplary load. Exemplary waveforms for the gate current $I_{GATE}$, which is driven by gate driver 302, drain-to-source voltage $V_{DS}$, drain current $I_D$, gate-to-source voltage $V_{GS}$, and control signal CTL illustrate an exemplary multi-phase turn-on process and an exemplary multiple phase turn-off process of high-power drive device 304. Target set current $I_{SET}$ illustrates exemplary target current levels (i.e., predetermined target current set points) that are used to program the actual gate current $I_{GATE}$ flowing into the gate of high-power drive device 304. The resulting drain current $I_D$ of high-power drive device 304, and associated voltages (e.g., drain-to-source voltage $V_{DS}$ and gate-to-source voltage $V_{GS}$) of high-power drive device 304 represent the response to an exemplary variable current drive profile that uses a combination of parameters, such as the Miller plateau voltages, the Miller clamp voltage, and the time limits for each phase of the multi-phase transition process. Although embodiments described herein use the Miller Plateau voltages as voltage thresholds for triggering a change in the target gate current level of a phase of a multi-phase turn-on process or multi-phase turn-off process of high-power drive device 304, other voltages, multiple switching voltages, current levels, or combinations thereof are used in other embodiments.

In at least one embodiment of the variable current drive technique, the characteristics of a multi-phase transition process for the high-power drive device are defined by the parameters of a normal turn-on profile (e.g., target current set point, a gate-to-source threshold voltage, and time limit for a phase of the multi-phase transition process). The normal turn-on process includes two phases: phase $P_{TON1}$ and phase $P_{TON2}$. Each phase of the normal turn-on process has a corresponding, individually programmed sourcing current level. For example, phase $P_{TON1}$ has target current set point $I_{ON1\_SET}$. In at least one embodiment of the normal turn-on process, the Miller plateau voltage $V_{PLAT\_ON}$ is used as the threshold voltage to trigger a transition from phase $P_{TON1}$ to phase $P_{TON2}$. In at least one embodiment of the normal turn-on process, target current set point $I_{ON1\_SET}$ is greater than target current set point $I_{ON\_SET2}$ (i.e., $I_{ON1\_SET} > I_{ON2\_SET}$) and time limit $t_{ON1}$ triggers a transition from phase $P_{TON1}$ to phase $P_{TON2}$ to limit the amount of time that the higher current level of target current set point $I_{ON1\_SET}$ is used to limit EMI. The normal turn-on process enters phase $P_{TON2}$ even if the gate-to-source voltage $V_{GS}$ does not reach Miller plateau voltage $V_{PLAT\_ON}$ in response to expiration of time limit $t_{ON1}$. Thus, the normal turn-on process progresses from phase $P_{TON1}$ to phase $P_{TON2}$ in response to the gate-to-source voltage $V_{GS}$ of high-power drive device 304 exceeding Miller plateau voltage $V_{PLAT\_ON}$, or in response to the time elapsed in phase $P_{TON1}$ exceeding time limit $t_{ON1}$, whichever condition comes first. Once in phase $P_{TON2}$, the normal turn-on process does not return to phase $P_{TON1}$.

Phase $P_{TON2}$ has target current set point $I_{ON2\_SET}$. Another set of variable current drive turn-on profile parameters also control phase $P_{TON2}$ of the normal turn-on process. For example, current set point $I_{ON2\_SET}$ specifies the target sourcing current level for phase $P_{TON2}$ of the normal turn-on process. Time limit $t_{ON2}$ specifies the time at which gate-to-source voltage $V_{GS}$ is expected to be above the under-voltage threshold $V_{GSON\_UV}$. In at least one embodiment, control circuitry triggers a fault if time limit $t_{ON2}$ expires prior to gate-to-source voltage $V_{GS}$ exceeding under-voltage threshold $V_{GSON\_UV}$. In at least one embodiment of the variable current drive technique, after gate-to-source voltage $V_{GS}$ reaches voltage level $V_{POS}$, high-power drive device 304 remains on and drain current $I_D$ increases at a rate of $V_{DC\_LINK}/L$. A transition of control signal CTL triggers another multi-phase transition process that causes gate-to-source voltage $V_{GS}$ to exceed (i.e., fall below) Miller plateau voltage $V_{PLAT\_OFF}$.

In at least one embodiment of the variable current drive technique, the characteristics of a multi-phase transition process are defined by the parameters of a normal turn-off profile (e.g., a target current set point, a threshold voltage, and a time limit for a phase of the multi-phase transition process). The normal turn-off process includes three phases: phase $P_{TOFF1}$, phase $P_{TOFF2}$, and phase $P_{TOFF3}$. Each of the phases has a corresponding, individually programmed sinking current level. For example, phase $P_{TOFF1}$, phase $P_{TOFF2}$, and phase $P_{TOFF3}$ have target current set point $I_{OFF1\_SET}$, target current set point $I_{OFF2\_SET}$, and target current set point $I_{MC\_SET}$, respectively. In at least one embodiment, target current set point $I_{OFF1\_SET}$ is greater than target current set point $I_{OFF2\_SET}$ (i.e., $I_{OFF1\_SET} \geq I_{OFF2\_SET}$) and target current set point $I_{MC\_SET}$ is greater than or equal to target current set point $I_{OFF1\_SET}$ and greater than target current set point $I_{OFF2\_SET}$ (i.e., $I_{MC\_SET} \geq I_{OFF1\_SET}$ and $I_{MC\_SET} > I_{OFF2\_SET}$).

Normal turn-off profile parameters including a current level parameter, a threshold voltage parameter and a time parameter (e.g., target current set point $I_{OFF1\_SET}$, threshold voltage $V_{PLAT\_OFF}$, and time limit $t_{OFF1}$) control phase $P_{TOFF1}$. Target current set point $I_{OFF1\_SET}$ specifies the target sinking current level for phase $P_{TOFF1}$, threshold voltage $V_{PLAT\_OFF}$, specifies the threshold voltage for triggering a transition from phase $P_{TOFF1}$ to phase $P_{TOFF2}$ of the normal turn-off process. The time parameter, time limit $t_{OFF1}$ specifies the time limit for phase $P_{TOFF1}$ of the normal turn-off process. Variable current drive normal turn-off profile parameters (e.g., target current set point $I_{OFF2\_SET}$, threshold voltage $V_{MC}$, and time limit $t_{OFF2}$) control phase $P_{TOFF2}$. The current parameter specifies the target sinking current level for phase $P_{TOFF2}$ of the normal turn-off process. The voltage parameter, Miller clamp voltage $V_{MC}$, specifies the threshold voltage for triggering a transition to phase $P_{TOFF3}$, thereby triggering the internal Miller clamp function of the variable strength driver. The time parameter specifies time limit $t_{OFF2}$ for phase $P_{TOFF2}$ to trigger a transition to phase $P_{TOFF3}$ of the normal turn-off process.

Phase $P_{TOFF3}$ of the normal turn-off process is controlled by normal turn-off profile parameters current set point $I_{MC\_SET}$ and time limit $t_{OFF3}$. Current $I_{MC\_SET}$ Specifies the target sinking current level for phase $P_{TOFF3}$ of the normal turn-off process. The time limit $t_{OFF3}$ specifies the time at which gate-to-source voltage $V_{GS}$ is expected to fall below over-voltage threshold $V_{GSOFF\_OV}$, which represents the over-voltage limit for the gate-to-source voltage $V_{GS}$ during turn-off. In at least one embodiment, control circuitry triggers a fault if time limit $t_{OFF3}$ expires prior to gate-to-source voltage $V_{GS}$ falling below over-voltage threshold $V_{GSOFF\_OV}$.

In at least one embodiment, in response to each change in state of received control signal CTL, the variable current drive technique introduces a small deadtime, e.g., time delay $t_{DT}$, before initiating a corresponding multi-phase transition process (e.g., a turn-on process or a turn-off process) to reduce or eliminate shoot-through between the pull-up and the pull-down circuits of the gate driver. Multi-phase transition profiles, including parameters and number of phases, described herein are exemplary only. Transition profiles can be optimized for different objectives or operating conditions, to improve efficiency, reduce EMI, and reduce drain-to-source voltage $V_{DS}$ (or collector-to emitter voltage $V_{CE}$) voltage stress, as compared to the conventional approach. In at least one embodiment, a soft-shutdown turn-off profile implements a multi-phase soft shutdown turn-off process, which is initiated by gate driver 302 in response to detection of a fault (e.g., a short-circuited load of the power switch). In at least one embodiment, the soft-shutdown turn-off process uses the same turn-off process as a normal turn-off process, but with different parameters. For example, the target current set point $I_{SS2\_SET}$ parameter (which corresponds to target current set point $I_{OFF2\_SET}$ of the normal turn-off profile) is set to a lower value under short-circuit load conditions than that used for normal load currents to slow the turn-off process and reduce or eliminate any resulting overshoot of drain-to-source voltage $V_{DS}$ (or collector-to emitter voltage $V_{CE}$) that may damage the high-power drive device. In at least one embodiment of a multi-phase transition profile, a time limit in one or more phases of a turn-on process or a turn-off process triggers a measurement that is used to detect faults.

Figure 5:
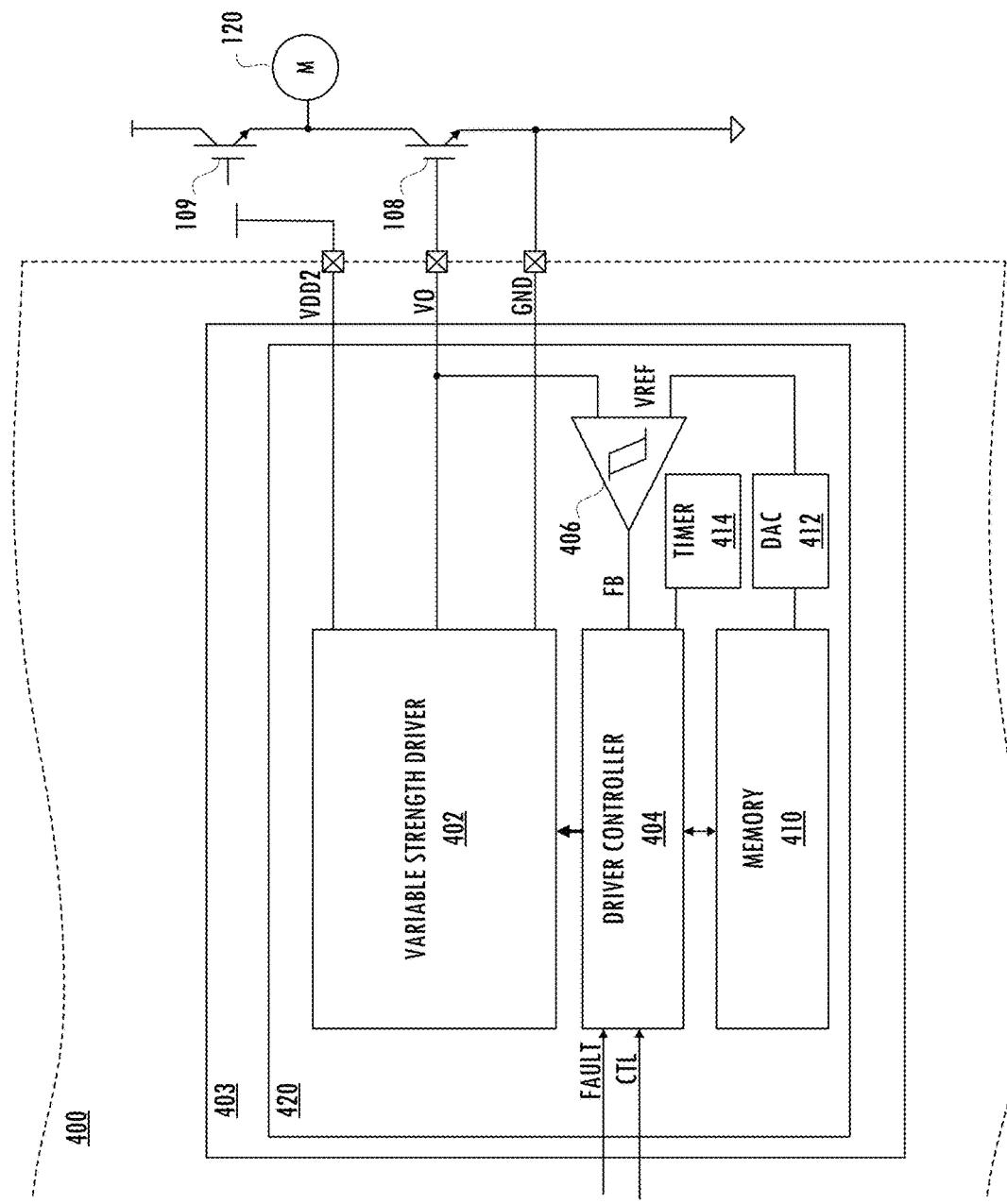
FIG. 5 illustrates a functional block diagram of a portion of a packaged driver integrated circuit product including a variable strength driver circuit consistent with at least one embodiment of the invention.

Referring to FIG. 5, in at least one embodiment, driver product 400 includes a primary-side integrated circuit, isolation barrier, and isolation communications channel (not shown in FIG. 5, but described above), and secondary-side integrated circuit 403. In at least one embodiment, secondary-side integrated circuit 403 of driver product 400 includes gate driver 420 coupled to terminal VO, which in some embodiments is the only terminal of driver product 400 that is coupled to the gate terminal of high-power drive device 108. In at least one embodiment, gate driver 420 integrates the Miller clamp function and eliminates external resistors coupled to high power drive device 108 described above. In at least one embodiment, gate driver 420 integrates other fault detection circuits described above (not shown).

In at least one embodiment of gate driver 420, driver controller 404 configures variable strength driver 402 to source current according to a normal turn-on profile in response to control signal CTL transitioning from a first value to a second value, configures variable strength driver 402 to sink current according to a normal turn-off profile in response to control signal CTL transitioning from the second value to the first value, or configures variable strength driver 402 to implement a soft-shutdown turn-off profile in response to control signal CTL having the second value and in response to a fault condition (e.g., a desaturation fault condition indicated by control signal FAULT). Exemplary turn-on, turn-off, and soft shutdown turn-off profiles are described above, although other profiles are used in other embodiments. The profiles independently determine values used by driver controller 404 to generate control signals using predetermined digital codes. Predetermined digital codes and other configuration parameters may be preloaded into memory 410, received from a serial interface of driver product 400, or provided to working registers of gate driver 420 or memory 410 using other techniques.

In at least one embodiment, driver controller 404 receives control signal CTL from a primary-side integrated circuit across the isolation barrier and receives a feedback signal from comparator 406, which in some embodiments is a hysteretic comparator. In at least one embodiment, comparator 406 receives a predetermined signal level from digital-to-analog converter 412. In at least one embodiment, the predetermined signal level code is stored digitally in memory 410 as part of a turn-on profile or turn-off profile and later converted to an analog signal for use by comparator 406. In other embodiments, instead of using an analog comparator, an analog-to-digital converter digitizes a level of a signal on terminal VO and digital comparison logic or driver controller 404 generates feedback signal FB, which is indicative of the comparison of gate-to-source voltage $V_{GS}$ of high-power drive device 108 to a predetermined threshold voltage of a turn-on or turn-off profile. In at least one embodiment of secondary-side circuit 403, at least one set of digital codes retrieved from memory 410 corresponds to a target current set point of a variable current drive profile. Driver controller 404 accesses those digital codes to set the output current, gate current $I_{GATE}$, provided by variable strength driver 402 to the gate of high-power drive device 108 according to the variable current drive profile.

Figure 6:
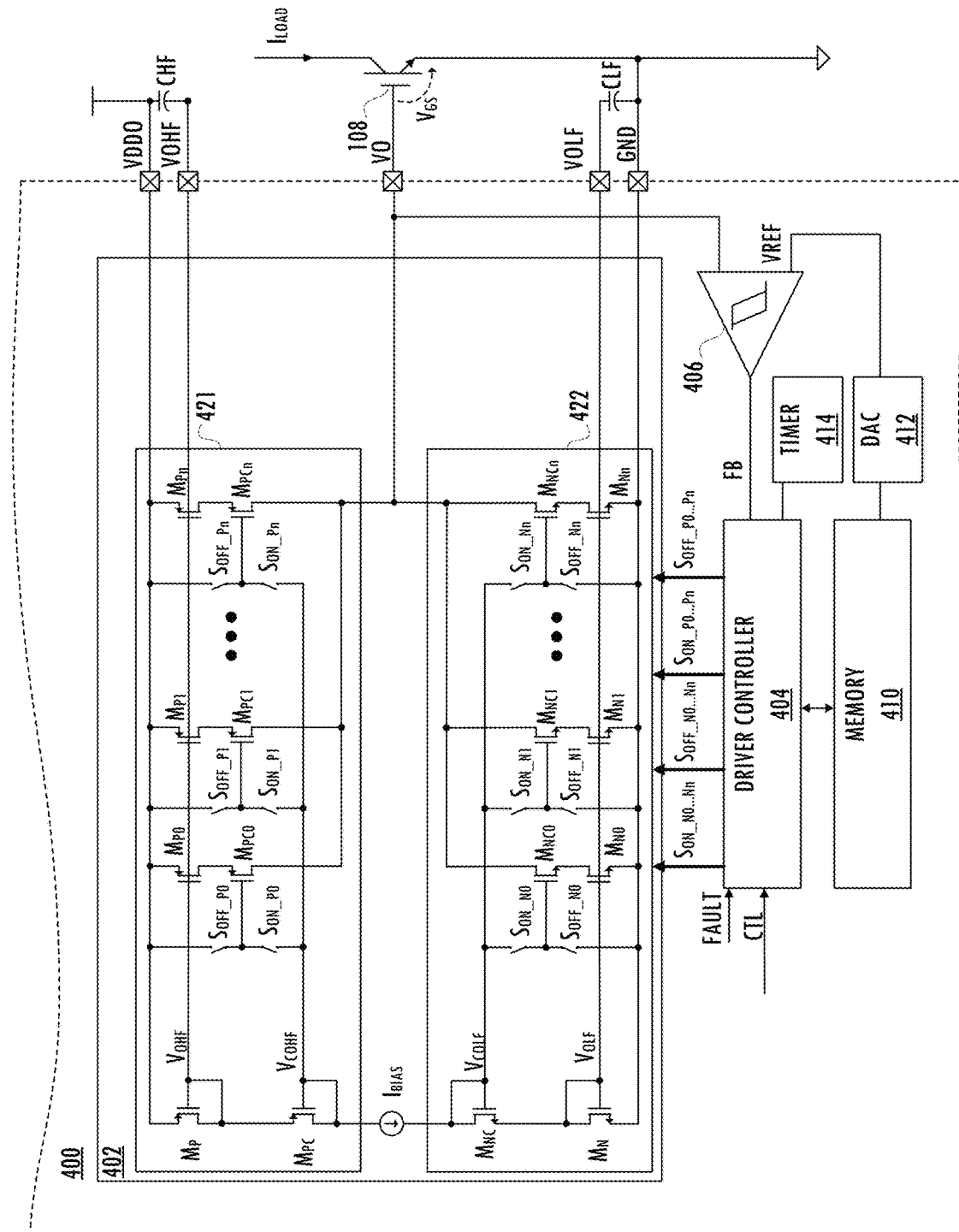
FIG. 6 illustrates a circuit diagram of an exemplary embodiment of a variable current driver circuit consistent with at least one embodiment of the invention.

Referring to FIG. 6, in at least one embodiment of gate driver 420, variable strength driver 402 is a variable current driver including current sources that generate gate current $I_{GATE}$ and corresponding voltages described above. In at least one embodiment, the current sources are implemented using current digital-to-analog converter (DAC) 421 and current DAC 422. Current DAC 421, which sources current to terminal VO in the turn-on process, is realized using p-type transistors. Current DAC 422, which sinks current from terminal VO in the turn-off process is realized with n-type transistors. Current DAC 421 and current DAC 422 each include a current-mirror structure with a fixed current input leg (e.g., transistors $M_P$ and $M_{PC}$ of current DAC 421 and $M_N$ and $M_{NC}$ of current DAC 422) and an output stage including binary-weighted branches or thermometer-weighted branches (e.g., branch including transistors $M_{P0}$ and $M_{PC0}$, branch including transistors $M_{P1}$ and $M_{PC1}$, . . . , branch including transistors $M_{Pn}$ and $M_{PCn}$ of current DAC 421 and branch including transistors $M_{N0}$ and $M_{NC0}$, branch including transistors $M_{N1}$ and $M_{NC1}$, ..., branch including transistors $M_{Nn}$ and $M_{NCn}$ of current DAC 422). Corresponding switches (e.g., switches $S_{OFF\_P0}$, $S_{ON\_P0}$, $S_{OFF\_P1}$, $S_{ON\_P1}$, ..., $S_{OFF\_Pn}$, and $S_{ON\_Pn}$ of current DAC 421 and switches $S_{OFF\_N0}$, $S_{ON\_N0}$, $S_{OFF\_N1}$, $S_{ON\_N1}$, ..., $S_{OFF\_Nn}$, and $S_{ON\_Nn}$ of current DAC 422) selectively enable branches of an output stage according to a target current $I_{SET}$. An exemplary manufacturing process provides transistors having different breakdown voltages by forming gate terminals using oxide layers of different thicknesses. An exemplary high-voltage device has a thicker gate oxide and therefore has a higher breakdown voltage than a low-voltage device that has a thinner gate oxide thickness. In at least one embodiment of variable strength driver 402, rather than using high-voltage transistors to interface to the high-voltage domain, low-voltage transistors are used to increase accuracy of the current provided to terminal VO. Low-voltage devices $M_{P0}$, ..., $M_{Pn}$ and $M_{N0}$, ..., $M_{Nn}$ are protected from high-voltages on terminal VO by corresponding cascode devices and provide an accurate output current to the gate of high-power drive device 108 independently from the wide range of voltages on terminal VO. Although each branch of the output stage includes a transistor and a selectively enabled cascode transistor, in other embodiments different numbers of transistors and branch topologies are used.

In an exemplary embodiment of variable strength driver 402, a maximum output current requirement is 12.4 A and is produced by a 5-bit (i.e., n=0, 1, 2, ..., 4) current mirror digital-to-analog converter circuit with an input bias current $I_{BIAS}$ of 1.24 mA and having a current gain of 10,000. The least significant bit of the binary-weighted digital-to-analog converter circuit corresponds to a current of 0.4 A. Transistors that are sized to generate that high output current create a large transient on the diode-connected input reference transistors $M_P$ or $M_N$ that generates the reference voltages $V_{OHF}$ and $V_{OLF}$ for each digital-to-analog converter circuit each time the digital input control code is updated. Therefore, variable strength driver 402 includes reservoir capacitor $C_{HF}$ and reservoir capacitor $C_{LF}$ coupled in parallel with diode-connected transistor $M_P$ of DAC 421 and diode-connected transistor $M_N$ of DAC 422, respectively, to reduce or eliminate DAC voltage reference glitches during transitions of the output current. In at least one embodiment of variable strength driver 402, the binary-weighted or thermometer-weighted branches of DAC 421 and DAC 422 are constructed out of a plurality of smaller individual devices that sum up to a target output device size. That structure reduces the impact of semiconductor manufacturing faults on the overall functionality of the output stage. In at least one embodiment, the DAC structure of the output stage and the least-significant bit size are selected to reduce the effect of a single failure.

In at least one embodiment, variable strength driver 402 is coupled to driver controller 404 and memory 410 or other control logic and associated memory, which store variable current drive working registers. In at least one embodiment, driver controller 404 controls the turn-on and turn-off processes based on the contents of memory 410 and parameter inputs. For example, the driver controller circuit generates digital control signals to configure variable strength driver 402 according to the target current level of an active phase of a multi-phase transition process and associated contents of the working registers. In at least one embodiment, driver controller 404 executes a state machine that updates the digital control signals to configure or reconfigure variable strength driver 402 to implement the various phases of the multi-phase transition process based on indicators of parameters (e.g., a sensor output indicative of a voltage level or a current level, a timer output indicative of elapsed time, or an indication of another parameter) and predetermined parameter values (e.g., target signal levels, threshold voltage, or time limit values) stored in memory. In at least one embodiment, a fast voltage comparator is external to a driver controller circuit and provides a parameter indicator, e.g., a feedback signal indicative of a comparison of the gate-to-source voltage $V_{GS}$ to a predetermined threshold voltage. In at least one embodiment, comparator 406 receives an analog threshold voltage VREF that corresponds to a predetermined digital value that is stored in memory 410 and converted to an analog signal via digital-to-analog converter 412. In at least one embodiment, a high-resolution counter included in timer 414 external to driver controller circuit 404 provides time information. Although only one timer, digital-to-analog converter, and comparator are illustrated and are shared for use during multiple phases of a multi-phase transition, in other embodiments, additional timers, digital-to-analog converters, and comparators are used.

The variable current drive technique partitions a transition process into multiple phases that have independent characteristics such as current levels, threshold voltages, and time limits. In at least one embodiment, during operation, a multi-phase transition process of the high-power drive device is controlled using parameter values stored in working registers. In at least one embodiment, each parameter value is specified as an index into a corresponding look-up table of parameter values (e.g., voltage, current, or time values).

FIGS. 7A and 7B illustrate exemplary variable current drive parameter value selections for a two-phase turn-on process, a three-phase turn-off process, and a three-phase soft shutdown process described above, although other embodiments use other numbers of phases for a turn-on process, turn-off process, or soft-shutdown process. In at least one embodiment, an alternate soft shutdown process is provided. In at least one embodiment, working registers specify variable current drive parameter values for operating the gate driver in an exemplary automotive traction inverter application. For example, phase $P_{TON1}$ of the multi-phase turn-on process described above is controlled by parameter value selections stored in register ON_P1, e.g., register bits $I_{ON1\_SET}$, register bits $t_{ON1}$, and register bits $V_{PLAT\_ON}$. Phase $P_{TON2}$ of the multi-phase turn-on process described above is controlled by parameter value selections stored in register ON_P2, e.g., register bits $I_{ON2\_SET}$, register bits $t_{ON2}$, and register bits $V_{GSON\_UV}$. Phase $P_{TOFF1}$ of the multi-phase turn-off process described above is controlled by parameter value selections stored in register OFF_P1, e.g., register bits $I_{OFF1\_SET}$, register bits $t_{OFF1}$, and register bits $V_{PLAT\_OFF}$. Phase $P_{TOFF2}$ of the multi-phase turn-off process described above is controlled by parameter value selections stored in register OFF_P2, e.g., register bits $I_{OFF2\_SET}$, register bits $t_{OFF2}$, and register bits $V_{MC}$. Phase $P_{TOFF3}$ of the multi-phase turn-off process described above is controlled by parameter value selections stored in register OFF_P3, e.g., register bits $I_{MC\_SET}$, register bits $t_{OFF3}$, and register bits $V_{GSOFF\_OV}$. In at least one embodiment, a multi-phase soft shutdown process reuses the turn-off registers, e.g., for soft shutdown parameter value selections.

In at least one embodiment, phase $P_{SSB\_P1}$ of a soft shutdown process is controlled by phase one parameter value selections stored in register SSB_P1, e.g., register bits $I_{SSB1\_SET}$, register bits $t_{SSB1}$, and register bits $V_{PLAT\_SSB}$, phase $P_{SSB\_P2}$ of the turn-off process is controlled by parameters stored in register SSB_P2, e.g., register bits $I_{SSB2\_SET}$ and register bits $t_{SSB2}$. In at least one embodiment, phase three and associated registers and register $V_{MC}$ of phase two are unused by the exemplary soft shutdown process. In an exemplary embodiment, a register corresponding to a parameter value selection stores an index value (e.g., a 3-bit index value) that points to a parameter value (e.g., an 8-bit parameter value or a 5-bit parameter value) in an associated parameter value look-up table. The selected table value is loaded into a corresponding working register (e.g., working register for a timing threshold, a working register for a voltage threshold, or a working register for a current setpoint). In at least one embodiment, register bits $V_{GSON\_UV}$, $V_{GSON\_OV}$, $V_{GSOFF\_OV}$, and $V_{MC}$ do not index parameter lookup tables, but rather, are directly encoded parameter value selections (e.g., using three bits). In at least one embodiment, the register bits of $I_{MC}$ of SSA_P3 and SSA_P2 are the same as the register bits of $I_{MC}$ for OFF_P3. In other embodiments, other selected parameter values and information storage and update techniques are used. As referred to herein, a profile component is a stored set of parameter values for a phase of a multi-phase transition process (e.g., ON_P1 or OFF_P3). A variable current drive profile is a complete set of profile components for all multi-phase transitions of an embodiment of the variable current drive technique, representing values for ON_P1, ON_P2, OFF_P1, OFF_P2, OFF_P3, SS_P1, and SS_P2 in an exemplary embodiment.

Although variable strength driver 402 is configured according to a predetermined transition profile, variation in environmental conditions or manufacturing conditions may cause actual signal levels to deviate from target signal set points. Accordingly, techniques for measuring or estimating the actual signal levels in operation and providing indicators thereof, are desired. Conventional techniques for current measurement that are used to verify actual current levels include use of shunt resistors, inductive sensors, or Hall-effect sensors. However, use of shunt resistors for current measurement dissipates power, in general, and use of shunt resistors in a gate drive signal path is incompatible with variable current driver embodiments. Typical inductive sensors and Hall-effect sensors are too slow to measure currents during turn-on or turn-off of fast power switching devices in some applications.

A technique for verifying that actual signal levels provided by a variable strength driver to an external high-power drive device are within target ranges for predetermined target signal set points is disclosed. In at least one embodiment, a variable strength driver uses an output node to provide a signal including a multi-phase transition based on corresponding set points in response to a change in state of an input signal. For example, the variable strength driver described above provides a gate current to a high-power drive device using an output node. The gate-to-source voltage of the high-power drive device coupled to the output node includes a multi-phase transition corresponding to multiple set points of the gate current in response to a change in state of an input signal. For each phase of a multi-phase transition of the signal, the technique determines whether the actual signal level is within a target signal range for the phase, exceeds the target signal range for the phase, or fails to reach the target signal set point.

In at least one embodiment, the signal validation technique validates current provided by a gate driver product during each of the phases of a turn-on transition of a high-power drive device and each of the phases of a turn-off transition of the high-power drive device responsive to a control signal (e.g., each of the phases of the multi-phase variable current drive profiles described above). In other embodiments, the signal validation technique is used with other numbers of transition phases and the values of parameters used in the turn-on process, turn-off process, and current validation technique vary according to the selected switching device, application circuit, and operating environment. In at least one embodiment, those specific values are determined by characterization of the application circuit.

In at least one embodiment, the signal validation technique uses turn-on parameters (e.g., $I_{ON1\_SET}$, $V_{PLAT\_ON}$, $t_{ON1}$, $I_{ON2\_SET}$, $V_{GSON\_UV}$, $t_{ON2}$), turn-off parameters (e.g., $I_{OFF1\_SET}$, $V_{PLAT\_OFF}$, $t_{OFF1}$, $I_{OFF2\_SET}$, $V_{MC}$, $t_{OFF2}$), and Miller clamp parameters (e.g., $I_{MC\_SET}$, $V_{GSOFF\_OV}$, $t_{OFF3}$), although in other embodiments, the validation technique uses other parameters. In general, the gate or control terminal of the high-power drive device has a current-voltage relationship similar to that of ideal capacitors, e.g., the gate-to-source voltage ($V_{GS}$) is a function of the time integral of the current delivered to the gate. Thus, the current can be estimated using the time derivative of the gate-to-source voltage. The signal validation technique determines whether the actual current level delivered by a variable current drive gate driver to the gate of the high-power drive device, or from the gate of the high-power drive device, is within a target range of current using a fast voltage comparator to sense the gate-to-source voltage in combination with a high-resolution counter to measure time. For example, the high-resolution counter has a resolution that is at least one order of magnitude greater than a turn-on time of the high-power drive device and the voltage comparator is at least one order of magnitude faster than the turn-on time of the high-power drive device. Since current in an ideal capacitor is I=C×dV/dt, higher resolution in measurement of dV and dt (e.g., high resolution voltage comparator or higher resolution timer) will increase accuracy of the current estimate.

In at least one embodiment of the signal validation technique, time limit $t_{ON1}$, which is the time limit for phase $P_{TON1}$, is inversely related to target current set point $I_{ON1\_SET}$, and time limit $t_{ON2}$, which is the time limit for phase $P_{TON2}$, is inversely related to target current set point $I_{ON2\_SET}$. Thus, the time that the variable strength driver is in a phase is used as a proxy for the actual current level of the phase. During phase $P_{TON2}$, the enabled pull-up circuit of the variable strength driver initially operates in saturation mode and transitions to triode mode as the gate-to-source voltage of the high-power drive device approaches its target value. The time that the enabled pull-up circuit of the variable strength driver spends in saturation mode is inversely related to target current set point $I_{ON2\_SET}$. The time that the enabled pull-up circuit of the variable strength driver spends in triode mode is directly related to the drain-to-source on resistance, $r_{DS(ON)}$ of the enabled pull-up circuit of the variable strength driver, and thus, is inversely related to target current set point $I_{ON2\_SET}$.

The signal validation technique also uses parameters that define a target range of current, which includes a corresponding current set point. For example, OC_MARGIN$_{ON1}$, OC_MARGIN$_{ON2}$, OC_MARGIN$_{OFF1}$, OC_MARGIN$_{OFF2}$, and OC_MARGIN$_{MC}$ correspond to overcurrent margins that set the overcurrent detection thresholds for actual current $I_{ON1}$, expressed as percentage of time limit $t_{ON1}$, for actual current $I_{ON2}$, expressed as percentage of time limit $t_{ON2}$, for actual current $I_{OFF1}$, expressed as percentage of time limit $t_{OFF1}$, for actual current $I_{OFF2}$, expressed as percentage of time limit $t_{OFF2}$, and for actual current $I_{MC}$, expressed as percentage of time limit $t_{OFF3}$, respectively. However, in other embodiments, the target range of current is defined by overcurrent margins expressed in different terms (e.g., absolute margin values).

In at least one embodiment, the signal validation technique verifies whether the actual current is within a target current range during a turn-on event or a turn-off event. The actual current is current sourced to output terminal VO or current sunk from output terminal VO. Referring to FIGS. 4 and 5, driver controller 404 configures variable strength driver 402 according to phase $P_{TON1}$ of a turn-on profile. Driver controller 404 initializes timer 414, configures variable strength driver 402 for target current set point $I_{ON1\_SET}$, and starts timer 414. Comparator 406 compares the voltage on node VO to voltage VREF, which is set to voltage $V_{PLAT\_ON}$ in phase $P_{tON1}$. In response to the voltage on node VO reaching voltage $V_{PLAT\_ON}$ or in response to timer 414 indicating the expiration of time limit $t_{ON1}$ (i.e., the output of timer 414 reaches time limit $t_{ON1}$), whichever comes first, driver controller 404 generates control signals that store the value of timer 414 as time $t_{COMP1}$ in memory 410. Driver controller 404 compares the value of time $t_{COMP1}$ to a value based on time limit $t_{ON1}$ and overcurrent margin OC_MARGIN$_{ON1}$ and determines whether the actual current $I_{ON1}$ is within the target current range. For example, if the value of time $t_{COMP1}$ is less than the value of $t_{ON1}/(1+OC\_MARGIN_{ON1})$, then the actual current is determined to be greater than the target current set point (i.e., $I_{ON1}>I_{ON1\_SET}$) and excessive current was sourced to output terminal VO during turn-on phase 1. If the value of time $t_{COMP1}$ equals the value of time limit $t_{ON1}$, then the actual current sourced to output terminal VO during turn-on phase 1 is determined to be less than the target current set point (i.e., $I_{ON1}<I_{ON1\_SET}$) since the time limit to achieve the target gate-to-source voltage expired. If the value of time $t_{COMP1}$ is between $t_{ON1}/(1+OC\_MARGIN_{ON1})$ and the time limit $t_{ON1}$ (i.e., $t_{ON1}/(1+OC\_MARGIN_{ON1})<t_{COMP1}<t_{ON1}$), then actual current is determined to be within the target range, i.e., $I_{ON1}$ is validated as correct (i.e., within a target current range).

In at least one embodiment, driver controller 404 configures variable strength driver 402 according to phase $P_{TON2}$ of a multi-phase turn-on profile. Driver controller 404 initializes timer 414, configures variable strength driver 402 for target current set point $I_{ON2\_SET}$, and starts timer 414. Comparator 406 compares the voltage on node VO to voltage VREF, which is set to voltage $V_{GSON\_UV}$. In response to the voltage on node VO reaching voltage $V_{GSON\_UV}$ or in response to timer 414 indicating the expiration of time limit $t_{ON2}$ (i.e., the output of timer 414 reaches time limit $t_{ON2}$), whichever comes first, driver controller 404 generates control signals that store the value of timer 414 as time $t_{COMP2}$ in memory 410. Driver controller 404 compares time $t_{COMP2}$ to a value based on time limit $t_{ON2}$ and overcurrent margin OC_MARGIN$_{ON2}$ and determines whether the actual current $I_{ON2}$ is within the target current range. For example, if the value of time $t_{COMP2}$ is less than the value of $t_{ON2}/(1+OC\_MARGIN_{ON2})$, then the actual current is determined to be greater than the target current set point (i.e., $I_{ON2}>I_{ON2\_SET}$) and excessive current was sourced to output terminal VO during turn-on phase 2. If the value of time $t_{COMP2}$ equals the value of time limit $t_{ON2}$, then the actual current sourced to output terminal VO during turn-on phase 2 is determined to be less than the target current set point (i.e., $I_{ON2}<I_{ON2\_SET}$) since the time limit to achieve target gate-to-source voltage expired. If the value of time $t_{COMP2}$ is between $t_{ON2}/(1+OC\_MARGIN_{ON2})$ and the time limit $t_{ON2}$ (i.e., $t_{ON2}/(1+OC\_MARGIN_{ON2})<t_{COMP2}<t_{ON2}$), then actual current is determined to be within the target range, i.e., $I_{ON2}$ is validated as correct (i.e., within a target current range).

In at least one embodiment, the validation technique verifies whether the actual delivered current is within a target current range during a turn-off event. Driver controller 404 configures variable strength driver 402 according to phase $P_{TOFF1}$ of a turn-off profile. Driver controller 404 initializes timer 414, configures variable strength driver 402 for target current set point $I_{OFF1\_SET}$, and starts timer 414. Comparator 406 compares the voltage on node VO to voltage VREF, which is set to voltage $V_{PLAT\_OFF}$. In response to the voltage on node VO reaching voltage $V_{PLAT\_OFF}$ or in response to timer 414 indicating the expiration of time limit $t_{OFF1}$ (i.e., the output of timer 414 reaches time limit $t_{OFF1}$), whichever comes first, driver controller 404 generates control signals that store the value of timer 414 as time $t_{COMP3}$ in memory 410. Driver controller 404 compares time $t_{COMP3}$ to a value based on time limit $t_{OFF1}$ and overcurrent margin OC_MARGIN$_{OFF1}$ and determines whether the actual current $I_{OFF1}$ is within the target current range. For example, if the value of time $t_{COMP3}$ is less than the value of $t_{OFF1}/(1+OC\_MARGIN_{OFF1})$, then the actual current is determined to be greater than the target current set point (i.e., $I_{OFF1}>I_{OFF1\_SET}$) and excessive current was sunk from output terminal VO during turn-off phase 1. If the value of time $t_{COMP3}$ equals the value of time limit $t_{OFF1}$, then the actual current sunk from output terminal VO during turn-off phase 1 is determined to be less than the target current set point (i.e., $I_{OFF1}<I_{OFF1\_SET}$) since the time limit to achieve the target gate-to-source voltage expired. If the value of time $t_{COMP3}$ is between $t_{OFF1}/(1+OC\_MARGIN_{OFF1})$ and the time limit $t_{OFF1}$ (i.e., $t_{OFF1}/(1+OC\_MARGIN_{OFF1})<t_{COMP3}<t_{OFF1}$), then actual current is determined to be within the target range, i.e., $I_{OFF1}$ is validated as correct (i.e., within a target current range).

In at least one embodiment, driver controller 404 configures variable strength driver 402 according to phase $P_{TOFF2}$ of a multi-phase turn-off profile. Driver controller 404 initializes timer 414, configures variable strength driver 402 for target current set point $I_{OFF2\_SET}$, and starts timer 414. Comparator 406 compares the voltage on node VO to voltage VREF, which is set to voltage $V_{MC}$. In response to the voltage on node VO reaching voltage $V_{MC}$ or in response to timer 414 indicating the expiration of time limit $t_{OFF2}$ (i.e., the output of timer 414 reaches time limit $t_{OFF2}$), whichever comes first, driver controller 404 generates control signals that store the value of timer 414 as time $t_{COMP4}$ in memory 410. Driver controller 404 compares time $t_{COMP4}$ to a value based on time limit $t_{OFF2}$ and overcurrent margin OC_MARGIN$_{OFF2}$ and determines whether the actual current $I_{OFF2}$ is within the target current range. For example, if the value of time $t_{COMP4}$ is less than the value of $t_{OFF2}/(1+OC\_MARGIN_{OFF2})$, then the actual current is determined to be greater than the target current set point (i.e., $I_{OFF2}>I_{OFF2\_SET}$) and excessive current was sunk from output terminal VO during turn-off phase 2. If the value of time $t_{COMP4}$ equals the value of time limit $t_{OFF2}$, then the actual current sunk from output terminal VO during turn-off phase 2 is determined to be less than the target current set point (i.e., $I_{OFF2}<I_{OFF2\_SET}$) since the time limit to achieve the target gate-to-source voltage expired. If the value of time $t_{COMP4}$ is between $t_{OFF2}/(1+OC\_MARGIN_{OFF2})$ and the time limit $t_{OFF2}$ (i.e., $t_{OFF2}/(1+OC\_MARGIN_{OFF2})<t_{COMP4}<t_{OFF2}$), then actual current is determined to be within the target range, i.e., $I_{OFF2}$ is validated as correct (i.e., within a target current range).

In at least one embodiment, driver controller 404 configures variable strength driver 402 as a Miller clamp according to phase $P_{TON3}$ of a multi-phase turn-off profile. Driver controller 404 initializes timer 414, configures variable strength driver 402 for target current set point $I_{MC\_SET}$, and starts timer 414. Comparator 406 compares the voltage on node VO to voltage VREF, which is set to voltage $V_{GSOFF\_OV}$. In response to the voltage on node VO reaching voltage $V_{GSOFF\_OV}$ or in response to timer 414 indicating the expiration of time limit $t_{OFF3}$ (i.e., the output of timer 414 reaches time limit $t_{OFF3}$), whichever comes first, driver controller 404 generates control signals that store the output of timer 414 as time $t_{COMP5}$ in memory 410. Driver controller 404 compares time $t_{COMP5}$ to a value based on time limit $t_{OFF3}$ and overcurrent margin $OC\_MARGIN_{OFF3}$ and determines whether the actual current $I_{MC}$ is within the target current range. For example, if the value of time $t_{COMP5}$ is less than the value of $t_{OFF3}/(1+OC\_MARGIN_{OFF3})$, then the actual current is determined to be greater than the target current set point (i.e., $I_{OFF3}>I_{MC\_SET}$) and excessive current was sunk from output terminal VO during turn-off phase 3. If the value of time $t_{COMP5}$ equals the value of time limit $t_{OFF3}$, then the actual current sunk from output terminal VO during turn-off phase 3 is determined to be less than the target current set point (i.e., $I_{OFF3}<I_{MC\_SET}$) since the time limit to achieve the target gate-to-source voltage expired. If the value of time $t_{COMP5}$ is between $t_{OFF3}/(1+OC\_MARGIN_{OFF3})$ and the time limit $t_{OFF3}$ (i.e., $t_{OFF3}/(1+OC\_MARGIN_{OFF3})<t_{COMP5}<t_{OFF3}$), then actual current is determined to be within the target range, i.e., $I_{OFF3}$ is validated as correct (i.e., within a target current range).

Figure 8:
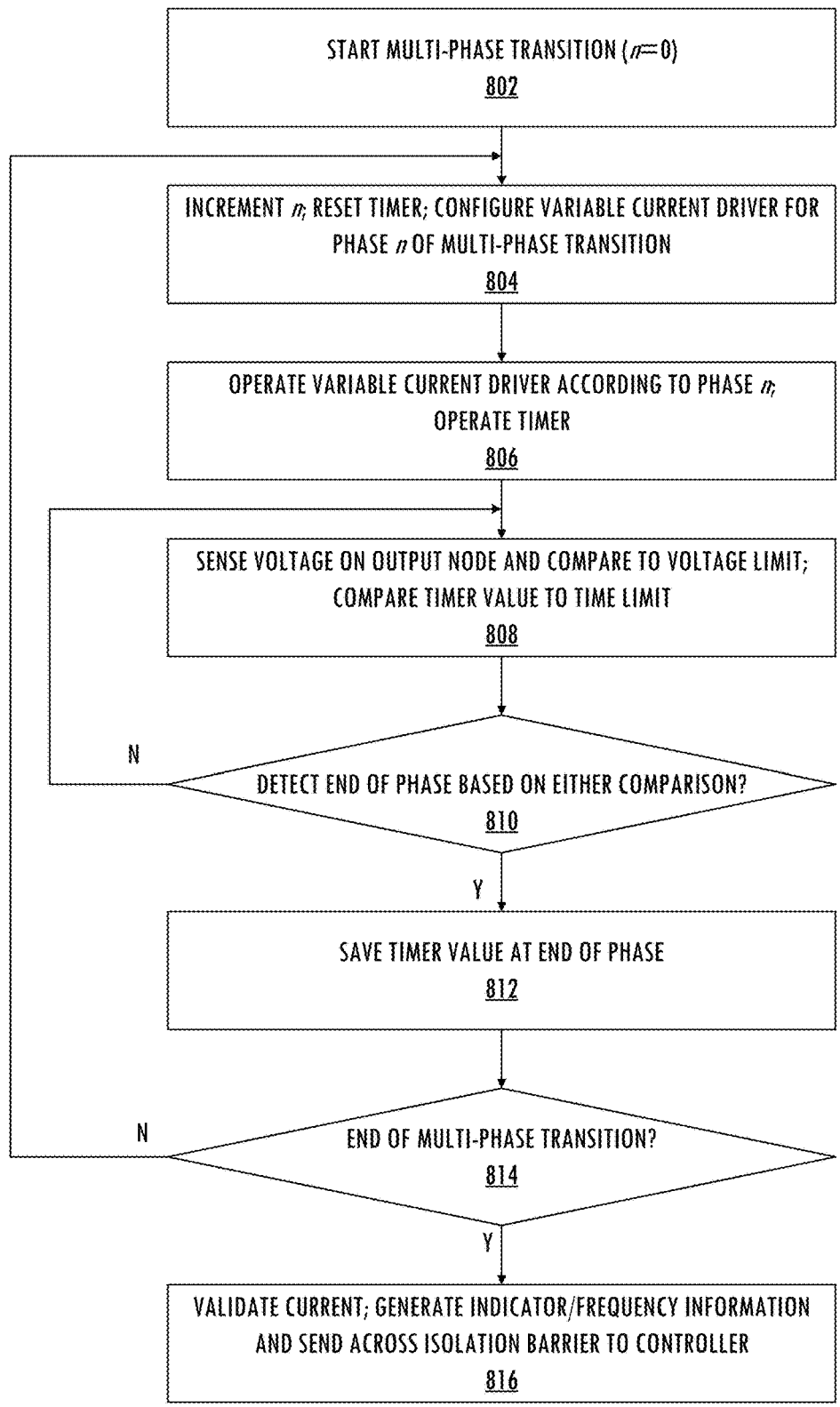
FIG. 8 illustrates exemplary information and control flows for validation of signal levels provided by a variable strength driver consistent with at least one embodiment of the invention.

Referring to FIGS. 4, 5, and 8, in at least one embodiment of the validation technique, driver controller 404 is configured to cause driver product 400 to execute a sequence of operations that validate one or more currents provided during a transition of a state of the high-power drive device based on a profile or other information stored in memory 410. In at least one embodiment, driver controller 404 includes a signal validation state machine that is configured to perform operations and generate control signals that cause gate driver 420 to perform the sequence of operations. In other embodiments, driver controller 404 includes a controller configured to execute instructions stored in memory 410 that cause gate driver 420 to perform the sequence of operations. An exemplary sequence of operations includes initializing the validation operation at the beginning of a multi-phase transition of the state of the high-power drive device (e.g., driver controller 404 initializes an index n=0) (802). Driver controller 404 increments index n to correspond to a first phase of the multi-phase transition, resets timer 414, and configures variable strength driver 402 according to the first phase (e.g., n=1) of a variable current drive profile stored in memory 410 (804). Driver controller 404 enables the variable strength driver 402 and timer 414 for operation (806). Comparator 406 senses the voltage on output terminal VO, which is coupled to the gate of high-power drive device 108, and compares the sensed voltage to voltage VREF, which corresponds to a voltage limit for that phase of the transition. In addition, driver controller 404 digitally compares the value of timer 414 to a time limit for that phase of the transition (808).

Driver controller 404 determines whether the end of the phase has been reached based on the voltage and time comparisons. If driver controller 404 does not detect the end of the phase based on the two comparisons (810), then driver controller 404 continues to sense the voltage on the output node, compare the sensed voltage to the voltage limit for that phase of the transition, and compare the timer value to a time limit defined in the profile for that phase of the transition (808). If driver controller 404 detects the end of the phase based either of the two comparisons (810), then driver controller 404 saves the timer value at the end of the phase (812) and determines whether the current phase is the last phase of the transition (814).

If the active phase is not the last phase of a multi-phase transition, then driver controller 404 configures gate driver 420 for the next phase of the multi-phase transition (e.g., by incrementing index n and configuring variable strength driver 402 for phase n of the multi-phase transition based on the variable current drive profile stored in memory) (804). If active phase is the last phase of a single-phase or multi-phase transition, then driver controller 404 validates the actual current provided to output terminal VO. In at least one embodiment, validation of the current includes generating at least one indication that the current provided during the phase is within a target current range. In at least one embodiment, driver controller 404 provides frequency information for the number of times that a transition (i.e., a rising transition or a falling transition) advances to a next phase of the transition based on a corresponding time limit or a corresponding voltage limit for an active phase of the transition. In at least one embodiment, the frequency information indicates a frequency of transitions between phases of the multi-phase transition triggered by achieving corresponding predetermined time limit for a corresponding phase versus triggered by achieving a predetermined voltage level for the corresponding phase. In at least one embodiment, gate driver 420 transmits a validation indicator or other information associated with validation across an isolation barrier to a controller on the primary side of the driver product (816). The information and control flow of FIG. 8 is exemplary only and other embodiments of gate driver 420 implement different sequences of events to perform current validation.

Figure 1:
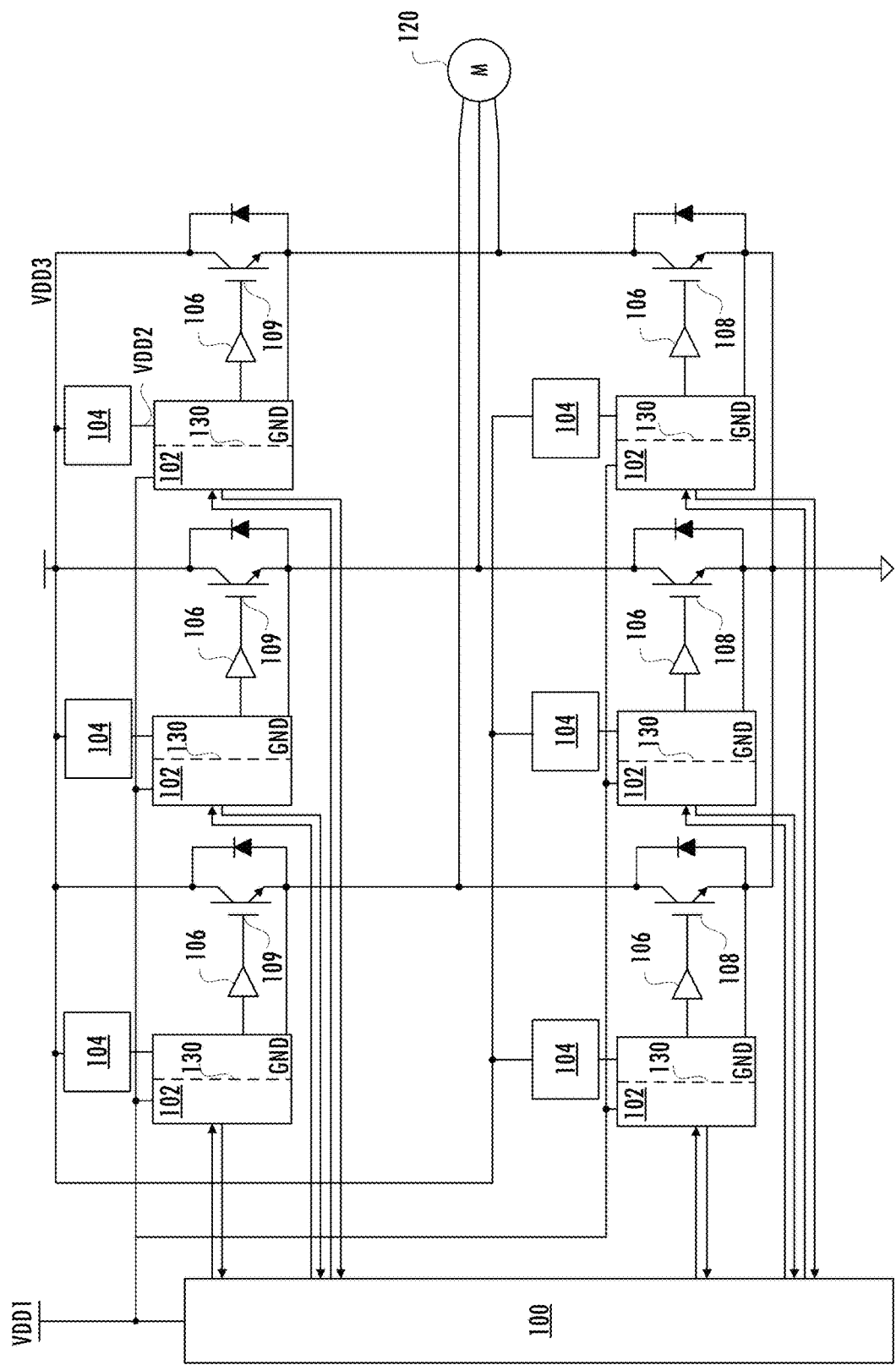
FIG. 1 illustrates a functional block diagram of a typical motor control system.

Referring to FIGS. 1 and 5, in at least one embodiment of a driver product, processor 100 is configured to update programmable features of driver product 400 or profile parameters (e.g., target current set point, threshold voltage, or time limit) stored in memory 410 of driver product 400 and to capture corresponding validation information received from driver product 400. In at least one embodiment, processor 100 or a user of processor 100 performs at least one iteration that updates operating parameters of driver product 400 based on information captured from driver product 400 to improve efficiency of a high-power drive device in a target application.

Thus, techniques for validating an output signal level of a gate driver are described. The description of the invention set forth herein is illustrative and is not intended to limit the scope of the invention as set forth in the following claims. For example, while the invention has been described in an embodiment in which a driver product is used in a motor application using two turn-on phases and three turn-off phases, one of skill in the art will appreciate that the teachings herein can be utilized in other applications and other numbers of turn-on phases or turn-off phases. Variations and modifications of the embodiments disclosed herein, may be made based on the description set forth herein, without departing from the scope of the invention as set forth in the following claims.

What is claimed is:

1. An isolated driver comprising:
a primary-side circuit configured to receive an input signal;
an isolation barrier coupled to the primary-side circuit; and
a secondary-side circuit coupled to the isolation barrier and including a driver circuit configured to provide a variable strength drive signal to an output node, and a driver controller circuit configured, in response to a change in the input signal, to control the driver circuit to adjust the variable strength drive signal, the secondary-side circuit configured to transmit feedback information across the isolation barrier to the primary-side circuit, the feedback information including triggering condition information about transitions in a multi-phase transition of the variable strength drive signal, the triggering condition information relating to a first type of phase transition triggering condition and a second type of phase transition triggering condition.

2. The isolated driver of claim 1 wherein the driver controller circuit changes a set point of the driver circuit to cause a transition between a first phase and a second phase in the multi-phase transition.

3. The isolated driver of claim 2 wherein the driver controller circuit is configured to update a multi-bit digital control signal to cause the change of the set point of the driver circuit.

4. The isolated driver of claim 3 wherein the driver circuit includes one or more digital to analog converters.

5. The isolated driver of claim 4 wherein the one or more digital to analog converters include transistor-based digital to analog converters.

6. The isolated driver of claim 1 wherein the secondary-side circuit is in a first voltage domain and the primary-side circuit is in a second voltage domain.

7. The isolated driver of claim 1 wherein the first type is based on time measurements, the second type is based on variable strength drive signal measurements, and the feedback information indicates a relative amount of transitions between phases in the multi-phase transition that were triggered by the first type versus transitions that were triggered by the second type.

8. The isolated driver of claim 7 wherein the feedback information indicates a frequency of transitions between phases in the multi-phase transition that were triggered by the first type versus transitions that were triggered by the second type.

9. A system comprising:
an isolated driver including primary-side circuit configured to receive an input signal, an isolation barrier coupled to the primary-side circuit, and a secondary-side circuit coupled to the isolation barrier and including a driver circuit configured to provide a variable strength drive signal to an output node, and a driver controller circuit configured, in response to a change in the input signal, to control the driver circuit to adjust the variable strength drive signal, the secondary-side circuit configured to transmit feedback information across the isolation barrier to the primary-side circuit, the feedback information including triggering condition information about transitions in a multi-phase transition of the variable strength drive signal, the triggering condition information relating to a first type of phase transition triggering condition and a second type of phase transition triggering condition; and
a drive device coupled to the output node.

10. The system of claim 9 wherein the driver controller circuit changes a set point of the driver circuit to cause a transition between a first phase and a second phase of the multi-phase transition.

11. The system of claim 10 wherein the driver controller circuit is configured to update a multi-bit digital control signal to cause the change of the set point of the driver circuit.

12. The system of claim 9 wherein the secondary-side circuit is in a first voltage domain and the primary-side circuit is in a second voltage domain.

13. The system of claim 12 wherein the first type is based on time measurements, the second type is based on variable strength drive signal measurements, and the feedback information indicates a relative amount of transitions between phases in the multi-phase transition that were triggered by the first type versus transitions that were triggered by the second type.

14. The system of claim 13 wherein the feedback information indicates a frequency of transitions between phases in the multi-phase transition that were triggered by the first type versus transitions that were triggered by the second type.

15. A method for operating an isolated driver, the method comprising:
receiving an input signal at a primary-side circuit of the isolated driver, an isolation barrier positioned between the primary-side circuit and a secondary-side circuit of the isolated driver;
providing a variable strength drive signal;
with the secondary-side circuit, in response to a change in the input signal, adjusting the variable strength drive signal; and
with the secondary-side circuit, transmitting feedback information across the isolation barrier to the primary-side circuit, the feedback information including triggering condition information about transitions in a multi-phase transition of the variable strength drive signal, the triggering condition information relating to a first type of phase transition triggering condition and a second type of phase transition triggering condition.

16. The method of claim 15 wherein adjusting the variable strength drive signal comprises changing a set point of a driver circuit to cause a transition between a first phase and a second phase of the multi-phase transition.

17. The method of claim 16 wherein adjusting the variable strength drive signal comprises updating a multi-bit digital control signal to cause the change of the set point of the driver circuit.

18. The method of claim 15 wherein the first type is based on elapsed time measurements, the second type is based on variable strength drive signal measurements, and the feedback information indicates a relative amount of transitions between phases in the multi-phase transition that were triggered by the first type versus transitions that were triggered by the second type.

19. The method of claim 18 wherein the feedback information indicates a frequency of transitions between phases in the multi-phase transition that were triggered by the first type versus transitions that were triggered by the second type.

* * * * *